United States Patent
Park et al.

(10) Patent No.: US 12,272,396 B2
(45) Date of Patent: Apr. 8, 2025

(54) METHOD OF GENERATING A MULTI-LEVEL SIGNAL USING SELECTIVE EQUALIZATION, METHOD OF TRANSMITTING DATA USING THE SAME, AND TRANSMITTER AND MEMORY SYSTEM PERFORMING THE SAME

(71) Applicant: SAMSUNG ELECTRONICS CO., LTD., Suwon-si (KR)

(72) Inventors: Junyoung Park, Seoul (KR); Younghoon Son, Yongin-si (KR); Hyunyoon Cho, Uiwang-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/449,066

(22) Filed: Aug. 14, 2023

(65) Prior Publication Data
US 2023/0395133 A1 Dec. 7, 2023

Related U.S. Application Data

(63) Continuation of application No. 17/321,678, filed on May 17, 2021, now abandoned.

(30) Foreign Application Priority Data

Aug. 21, 2020 (KR) .................. 10-2020-0105470

(51) Int. Cl.
*G11C 11/4093* (2006.01)
*G06F 13/16* (2006.01)
(Continued)

(52) U.S. Cl.
CPC ...... *G11C 11/4093* (2013.01); *G06F 13/1668* (2013.01); *G11C 11/4076* (2013.01)

(58) Field of Classification Search
CPC .............. G11C 7/1057; G11C 11/4093; G11C 11/4076; G11C 7/1051; G11C 11/4096; G11C 7/1084; G06F 13/1668
(Continued)

(56) References Cited

U.S. PATENT DOCUMENTS 8,199,866 B2 * 6/2012 Fuller ................ H03F 3/45179
375/355
8,576,903 B2 11/2013 Raphaeli et al.
(Continued)

FOREIGN PATENT DOCUMENTS

KR 10-2020-0014445 A 2/2020
WO 2019032328 2/2019

OTHER PUBLICATIONS

Final Office Action dated May 15, 2023 in corresponding U.S. Appl. No. 17/321,678.
(Continued)

*Primary Examiner* — Chun Kuan Lee
(74) *Attorney, Agent, or Firm* — F. Chau & Associates, LLC

(57) ABSTRACT

In a method of generating a multi-level signal having one of three or more voltage levels that are different from one another, input data including two or more bits is received. A drive strength of at least one of two or more driving paths is changed based on the two or more bits such that a first transition time, during which an output data signal is transitioned from a first voltage level to a second voltage level, is changed. The output data signal that is the multi-level signal is generated such that the first transition time of the output data signal is changed and a second transition time,
(Continued)

during which the output data signal is transitioned from the first voltage level to a third voltage level different from the second voltage level, is maintained.

20 Claims, 26 Drawing Sheets

(51) Int. Cl.
| | |
|---|---|
| *G11C 7/10* | (2006.01) |
| *G11C 7/22* | (2006.01) |
| *G11C 11/4076* | (2006.01) |
| *G11C 11/4096* | (2006.01) |
| *G11C 29/12* | (2006.01) |
| *G11C 29/18* | (2006.01) |
| *G11C 29/42* | (2006.01) |
| *H03K 5/1534* | (2006.01) |
| *H04L 25/02* | (2006.01) |
| *H04L 25/03* | (2006.01) |
| *H04L 25/06* | (2006.01) |
| *H04L 25/49* | (2006.01) |

(58) Field of Classification Search
USPC .............................................................. 710/5
See application file for complete search history.

(56) References Cited

U.S. PATENT DOCUMENTS

| | | |
|---|---|---|
| 8,594,262 B2 | 11/2013 | Slezak et al. |
| 10,447,512 B2 | 10/2019 | Lin et al. |
| 10,530,617 B2 | 1/2020 | Lin |
| 10,623,217 B1 | 4/2020 | Turner et al. |
| 2011/0311008 A1* | 12/2011 | Slezak ................... H03M 9/00 375/353 |
| 2015/0055694 A1 | 2/2015 | Juenemann et al. |
| 2017/0039163 A1 | 2/2017 | Sejpal et al. |
| 2019/0044762 A1* | 2/2019 | Lin ....................... G11C 29/022 |
| 2020/0059301 A1 | 2/2020 | Hu et al. |
| 2020/0119957 A1 | 4/2020 | Stojanovic |
| 2020/0136866 A1 | 4/2020 | Dong |
| 2020/0295978 A1* | 9/2020 | Farzan .................... H04L 27/08 |
| 2020/0313720 A1* | 10/2020 | Maarefi .................... H04B 3/04 |
| 2022/0059156 A1 | 2/2022 | Park et al. |

OTHER PUBLICATIONS

Office Action dated Feb. 8, 2023 in corresponding U.S. Appl. No. 17/321,678.

Examiner Interview Summary dated Oct. 12, 2022 in corresponding U.S. Appl. No. 17/321,678.

Office Action dated May 23, 2022 in corresponding U.S. Appl. No. 17/321,678.

Extended European Search Report dated Sep. 23, 2021 in corresponding European Patent Appln. Serial No. 21172784.7.

Jung, Hae-Kang et al. "A 4.35Gb/s/pin LPDDR4 I/O Interface with Multi-VOH Level, Equalization Scheme, and Duty- Training Circuit for Mobile Applications," 2015 Symposium on FLSI Circuits Digest of Technical Papers, 2 pages.

Korean Office Action Cited in Corresponding Korean Patent Application No. 10-2020-0105470, Dated Feb. 17, 2025, 6 Pages.

* cited by examiner

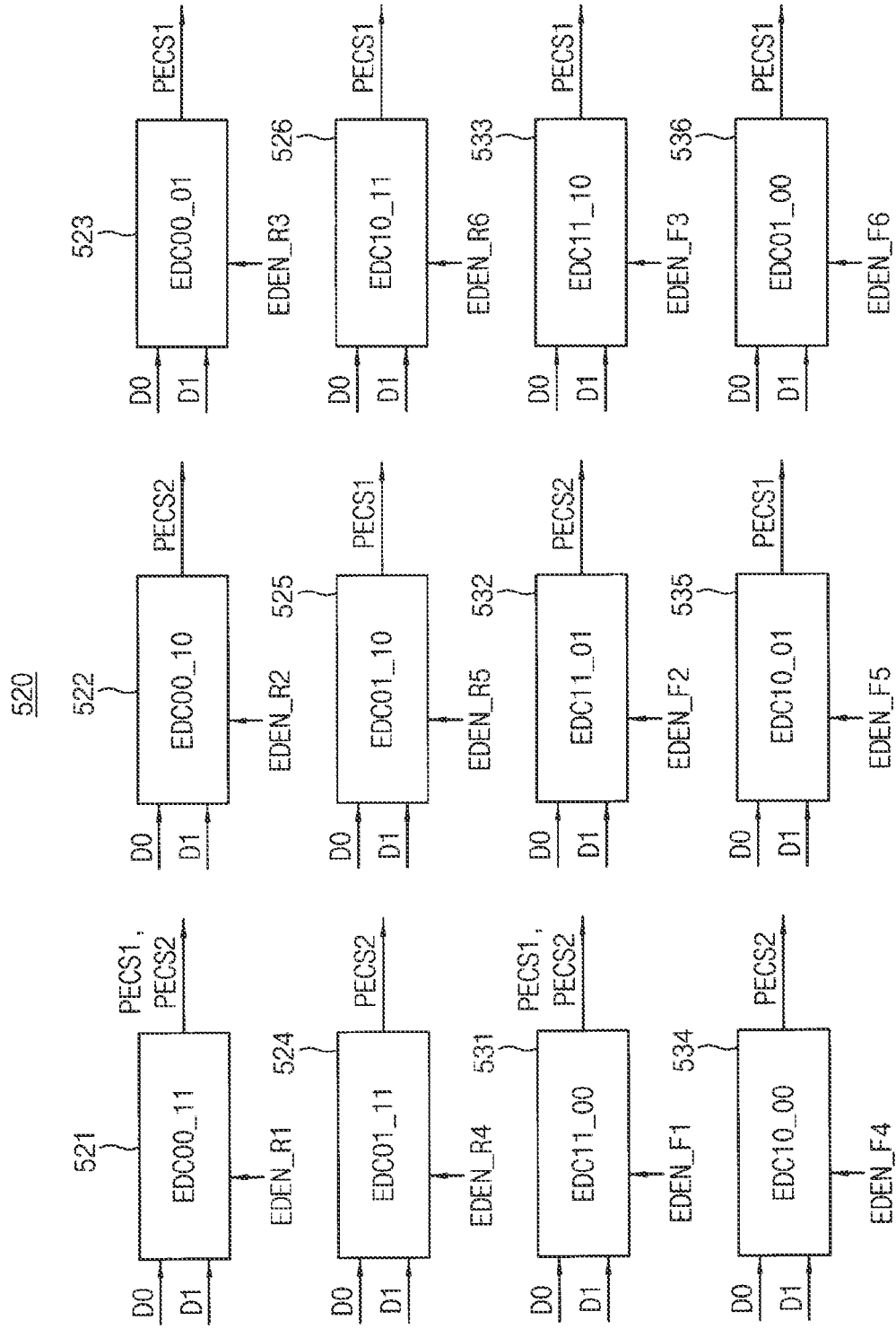

METHOD OF GENERATING A MULTI-LEVEL SIGNAL USING SELECTIVE EQUALIZATION, METHOD OF TRANSMITTING DATA USING THE SAME, AND TRANSMITTER AND MEMORY SYSTEM PERFORMING THE SAME

CROSS-REFERENCE TO RELATED APPLICATIONS

This U.S. non-provisional utility patent application is a continuation of U.S. patent application Ser. No. 17/321,678, titled METHOD OF GENERATING A MULTI-LEVEL SIGNAL USING SELECTIVE EQUALIZATION, METHOD OF TRANSMITTING DATA USING THE SAME, AND TRANSMITTER AND MEMORY SYSTEM PERFORMING THE SAME, and filed on May 17, 2021, which, in turn, claims priority under 35 U.S.C. § 119 to Korean Patent Application No. 10-2020-0105470, filed on Aug. 21, 2020 in the Korean Intellectual Property Office (KIPO), the disclosures of which are incorporated by reference herein in their entireties.

TECHNICAL FIELD

Exemplary embodiments of the inventive concept relate generally to semiconductor integrated circuits, and more particularly to methods of generating multi-level signals, methods of transmitting data using the methods of generating multi-level signals, and transmitters and memory systems that perform the methods of transmitting data and the methods of generating multi-level signals, respectively.

DISCUSSION OF RELATED ART

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered.

Recently, as the performance of semiconductor memory devices has improved, communication speed (or interface speed) between a memory controller and a semiconductor memory device has also increased. Thus, multi-level signaling in which a plurality of bits are transmitted during one unit interval (UI) has been researched.

SUMMARY

According to an exemplary embodiment of the inventive concept, in a method of generating a multi-level signal having one of three or more voltage levels that are different from one another, input data including two or more bits is received. A drive strength of at least one of two or more driving paths is changed based on the two or more bits such that a first transition time, during which an output data signal is transitioned from a first voltage level to a second voltage level, is changed. The output data signal that is the multi-level signal is generated such that the first transition time of the output data signal is changed and a second transition time, during which the output data signal is transitioned from the first voltage level to a third voltage level different from the second voltage level, is maintained.

According to an exemplary embodiment of the inventive concept, in a method of transmitting data based on a multi-level signal having one of three or more voltage levels that are different from one another, a first output data signal that is the multi-level signal is generated based on first input data. A second output data signal that is the multi-level signal is generated based on second input data. The first output data signal and the second output data signal are transmitted through a first channel and a second channel, respectively, that are different from each other. When generating the first output data signal, the first input data including two or more bits is received. A drive strength of at least one of two or more driving paths is changed based on the two or more bits included in the first input data such that a first transition time, during which the first output data signal is transitioned from a first voltage level to a second voltage level, is changed. The first output data signal is generated such that the first transition time of the first output data signal is changed and a second transition time, during which the first output data signal is transitioned from the first voltage level to a third voltage level different from the second voltage level, is maintained.

According to an exemplary embodiment of the inventive concept, in a method of generating a multi-level signal having one of a first voltage level, a second voltage level, a third voltage level, and a fourth voltage level that are different from one another, input data including a first bit and a second bit that are different from each other is received. The input data is divided into the first and second bits. It is determined, based on the first and second bits, whether a first edge in which an output data signal is transitioned from the first voltage level to the second voltage level is detected. When the first edge is detected, at least one of a first pre-emphasis control signal and a second pre-emphasis control signal is activated. The first pre-emphasis control signal is applied to a first driving path that operates based on the first bit, and the second pre-emphasis control signal is applied to a second driving path that operates based on the second bit. A drive strength of at least one of the first and second driving paths increases based on at least activated one of the first and second pre-emphasis control signals such that a first transition time, during which the output data signal is transitioned from the first voltage level to the second voltage level, decreases. The output data signal that is the multi-level signal is generated based on the first and second driving paths such that the first transition time of the output data signal is changed and a second transition time, during which the output data signal is transitioned from the first voltage level to the third voltage level, is maintained.

According to an exemplary embodiment of the inventive concept, a transmitter configured to generate a multi-level signal having one of three or more voltage levels that are different from one another includes a multiplexer, an edge detection logic circuit, and two or more driving paths. The multiplexer receives input data including two or more bits, and divides the input data into the two or more bits. The edge detection logic circuit detects a first edge based on the two or more bits, and activates at least one of two or more pre-emphasis control signals when the first edge is detected. The first edge is an edge in which an output data signal is transitioned from a first voltage level to a second voltage level. The two or more driving paths generate the output data signal that is the multi-level signal based on the two or more bits and the two or more pre-emphasis control signals. When the first edge is detected, the output data signal is generated by changing a drive strength of at least one of the two or more driving paths such that a first transition time, during which the output data signal is transitioned from the first voltage level to the second voltage level, is changed. A second transition time, during which the output data signal is transitioned from the first voltage level to a third voltage level different from the second voltage level, is maintained.

According to an exemplary embodiment of the inventive concept, a memory system configured to transmit data based on a multi-level signal having one of three or more voltage levels that are different from one another includes a memory controller, a memory device, a first channel, and a second channel. The memory controller includes a first transmitter and a second transmitter. The first transmitter generates a first output data signal that is the multi-level signal based on first input data. The second transmitter generates a second output data signal that is the multi-level signal based on second input data. The memory device includes a first receiver and a second receiver. The first receiver receives the first output data signal. The second receiver receives the second output data signal. The first channel connects the first transmitter with the first receiver, and transmits the first output data signal. The second channel connects the second transmitter with the second receiver, and transmits the second output data signal. The first transmitter includes a multiplexer, an edge detection logic circuit, and two or more driving paths. The multiplexer receives the first input data including two or more bits, and divides the first input data into the two or more bits. The edge detection logic circuit detects a first edge based on the two or more bits, and activates at least one of two or more pre-emphasis control signals when the first edge is detected. The first edge is an edge in which the first output data signal is transitioned from a first voltage level to a second voltage level. The two or more driving paths generate the first output data signal based on the two or more bits and the two or more pre-emphasis control signals. When the first edge is detected, the first output data signal is generated by changing a drive strength of at least one of the two or more driving paths such that a first transition time, during which the first output data signal is transitioned from the first voltage level to the second voltage level, is changed. A second transition time, during which the first output data signal is transitioned from the first voltage level to a third voltage level different from the second voltage level, is maintained.

According to an exemplary embodiment of the inventive concept, a memory system configured to transmit data based on a multi-level signal having one of three or more voltage levels that are different from one another includes a memory device, a memory controller, a first channel, and a second channel. The memory device includes a first transmitter and a second transmitter. The first transmitter generates a first output data signal that is the multi-level signal based on first input data. The second transmitter generates a second output data signal that is the multi-level signal based on second input data. The memory controller includes a first receiver and a second receiver. The first receiver receives the first output data signal. The second receiver receives the second output data signal. The first channel connects the first transmitter with the first receiver, and transmits the first output data signal. The second channel connects the second transmitter with the second receiver, and transmits the second output data signal. The first transmitter includes a multiplexer, an edge detection logic circuit, and two or more driving paths. The multiplexer receives the first input data including two or more bits, and divides the first input data into the two or more bits. The edge detection logic circuit detects a first edge based on the two or more bits, and activates at least one of two or more pre-emphasis control signals when the first edge is detected. The first edge is an edge in which the first output data signal is transitioned from a first voltage level to a second voltage level. The two or more driving paths generate the first output data signal based on the two or more bits and the two or more pre-emphasis control signals. When the first edge is detected, the first output data signal is generated by changing a drive strength of at least one of the two or more driving paths such that a first transition time, during which the first output data signal is transitioned from the first voltage level to the second voltage level, is changed. A second transition time, during which the first output data signal is transitioned from the first voltage level to a third voltage level different from the second voltage level, is maintained.

According to an exemplary embodiment of the inventive concept, a transmitter configured to generate a multi-level signal having one of three or more voltage levels that are different from one another includes a multiplexer, an edge detection logic circuit, a first driving path, and a second driving path. The multiplexer is configured to divide input data into two or more bits. The edge detection logic circuit is configured to detect a first edge based on the two or more bits, and to activate at least one of a first pre-emphasis control signal and a second pre-emphasis control signal when the first edge is detected. The first edge is an edge in which an output data signal is transitioned from a first voltage level to a second voltage level. The first driving path includes a first pre-emphasis driver circuit configured to generate a first current in response to the first pre-emphasis control signal, and a first data buffer configured to receive one of the two or more bits. The second driving path includes a second pre-emphasis driver circuit configured to generate a second current in response to the second pre-emphasis control signal, and a second data buffer configured to receive one of the two or more bits. The first driving path and the second driving path include driver circuits configured to generate driving currents, and the second driving path includes more driver circuits than the first driving path. The first and second driving paths generate the output data signal that is the multi-level signal based on the driving currents generated by the driver circuits and the first and second currents generated by the first and second pre-emphasis driver circuits. When the first edge is detected, the output data signal is generated by changing a drive strength of at least one of the first and second driving paths such that a first transition time, during which the output data signal is transitioned from the first voltage level to the second voltage level, is changed. A second transition time, during which the output data signal is transitioned from the first voltage level to a third voltage level different from the second voltage level, is maintained.

BRIEF DESCRIPTION OF THE DRAWINGS

The above and other features of the inventive concept will be more clearly understood by describing in detail exemplary embodiments thereof with reference to the accompanying drawings.

FIG. 9 is a block diagram illustrating an edge detection logic included in the transmitter of FIG. 8 according to an exemplary embodiment of the inventive concept.

DETAILED DESCRIPTION OF THE EMBODIMENTS

Figure 1:
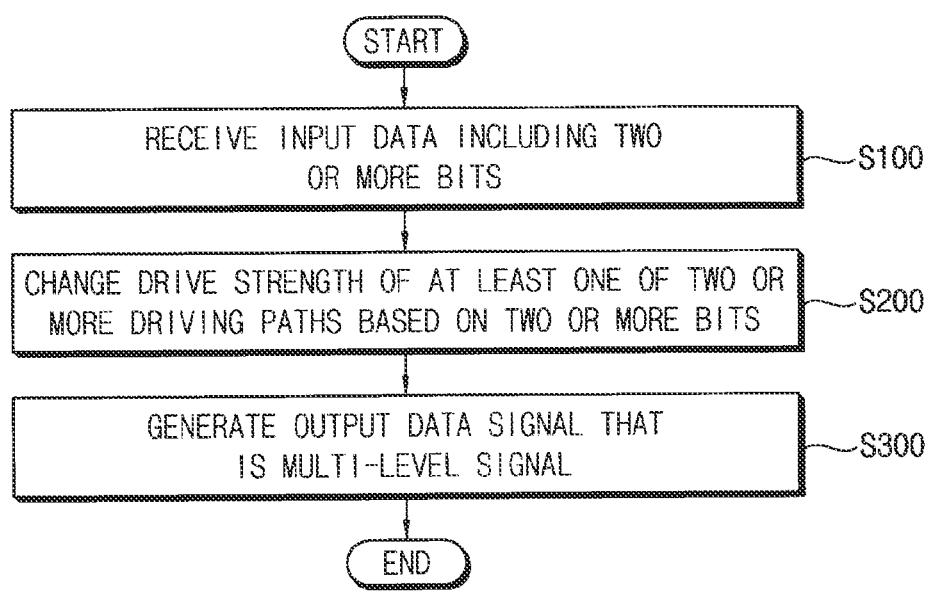
FIG. 1 is a flowchart illustrating a method of generating a multi-level signal according to an exemplary embodiment of the inventive concept.

Exemplary embodiments of the inventive concept provide a method of generating a multi-level signal capable of having improved or enhanced signal characteristics using selective equalization while a signal is generated based on multi-level signaling.

Exemplary embodiments of the inventive concept also provide a method of transmitting data using the method of generating the multi-level signal.

Exemplary embodiments of the inventive concept further provide a transmitter and a memory system that perform the method of transmitting the data and the method of generating the multi-level signal, respectively.

Exemplary embodiments of the inventive concept will be described more fully hereinafter with reference to the accompanying drawings. Like reference numerals may refer to like elements throughout this application.

FIG. 1 is a flowchart illustrating a method of generating a multi-level signal according to an exemplary embodiment of the inventive concept.

Referring to FIG. 1, a method of generating a multi-level signal according to an exemplary embodiment of the inventive concept is performed to transmit or issue a multi-level signal that has one of three or more different voltage levels during one unit interval (UI), and is performed by a transmitter that generates or transmits the multi-level signal. The transmitter may be included in various communication systems and/or signal transmission systems, and may be included in, for example, a memory system. Configurations of the transmitter, the memory system, and the multi-level signal will be described in detail later.

In the method of generating the multi-level signal according to an exemplary embodiment of the inventive concept, input data including two or more bits is received (operation S100). For example, the input data may be multi-bit data for generating the multi-level signal.

A drive strength of at least one of two or more driving paths (or data paths) is changed based on the two or more bits included in the input data (operation S200). For example, the two or more driving paths may be included in the transmitter, and each of the two or more driving paths may operate based on a respective one of the two or more bits. For example, the drive strength of the at least one of the two or more driving paths may be changed such that a first transition time, during which an output data signal is transitioned from a first voltage level to a second voltage level, is changed (e.g., such that a first slope, at which the output data signal is transitioned from the first voltage level to the second voltage level, is changed). The first transition time may represent a time interval for transitioning the output data signal from the first voltage level to the second voltage level. The operation of changing the drive strength may be referred to as an equalizing operation or an equalization. Operation S200 will be described with reference to FIGS. 2 and 13.

The output data signal that is the multi-level signal is generated based on the input data and operation S200 (operation S300). For example, when generating the output data signal, the first transition time for transitioning from the first voltage level to the second voltage level may be changed (e.g., the first slope may be changed), and a second transition time, during which the output data signal is transitioned from the first voltage level to a third voltage level (different from the second voltage level), may be maintained or unchanged (e.g., a second slope, at which the output data signal is transitioned from the first voltage level to the third voltage level, may be maintained). The second transition time may represent a time interval for transitioning the output data signal from the first voltage level to the third voltage level. In other words, the equalizing operation may be performed when the output data signal is transitioned from the first voltage level to the second voltage level, and the equalizing operation may not be performed when the output data signal is transitioned from the first voltage level to the third voltage level.

In the method according to an exemplary embodiment of the inventive concept, the output data signal is generated based on a multi-level signaling scheme. The multi-level signaling scheme may be used as a means of compressing bandwidth to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be half of the bit rate.

In other words, the multi-level signaling scheme may be used to increase a data transmission (or transfer) rate without increasing the frequency of data transmission and/or a transmission power of the communicated data. An example of one type of the multi-level signaling scheme may be a pulse-amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, the inventive concept is not limited thereto, and exemplary embodiments of the inventive concept may be applied or employed to a K-level PAM (e.g., PAM(K)) having K possible pulse amplitudes, where K is a natural number greater than or equal to three.

In the method of generating the multi-level signal according to an exemplary embodiment of the inventive concept, a selective or adaptive equalization scheme may be implemented. In the selective equalization scheme, existing or conventional driving paths may be used as is, and the equalizing operation may be performed only when a specific level transition occurs on the output data signal. In other words, the equalizing operation may be performed only on some level transitions that are capable of occurring on the multi-level signal. Accordingly, as compared to an example where the equalizing operation is performed on all level transitions, power consumption may be reduced and the signal characteristic may be efficiently improved or enhanced.

Figure 2:
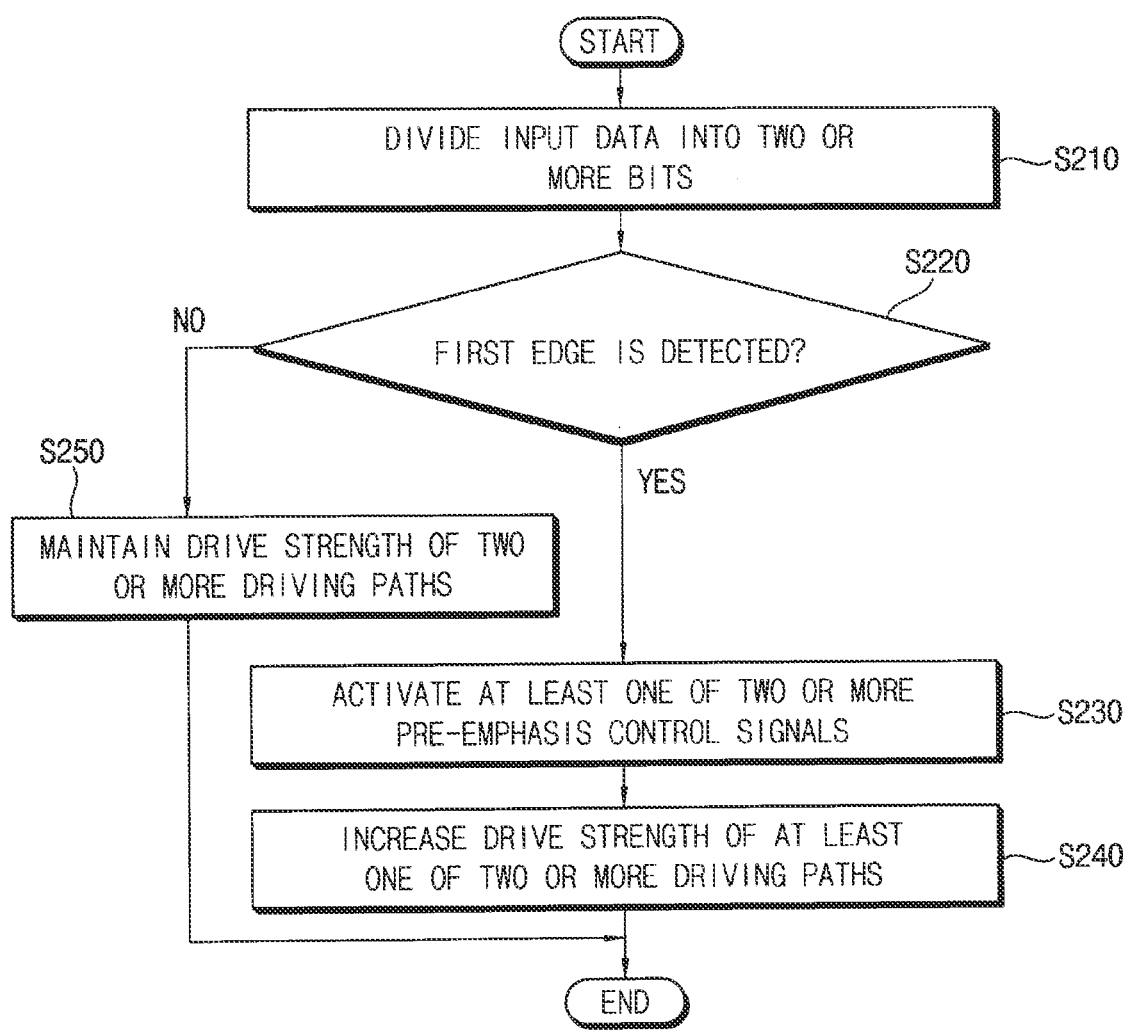
FIG. 2 is a flowchart illustrating an example of changing a drive strength of at least one of two or more driving paths in FIG. 1 according to an exemplary embodiment of the inventive concept.

FIG. 2 is a flowchart illustrating an example of changing a drive strength of at least one of two or more driving paths in FIG. 1 according to an exemplary embodiment of the inventive concept.

Referring to FIGS. 1 and 2, when changing the drive strength of the at least one of the two or more driving paths (operation S200 of FIG. 1), the input data may be divided into the two or more bits (operation S210). It may be determined based on the two or more bits whether a first edge in which the output data signal is transitioned from the first voltage level to the second voltage level is detected (operation S220).

According to an exemplary embodiment of the inventive concept, the first voltage level may correspond to a lowest voltage level and the second voltage level may correspond to a highest voltage level. However, the inventive concept is not limited thereto. For example, the first voltage level may not correspond to the lowest voltage level, or the second voltage level may not correspond to the highest voltage level.

When the first edge is detected (operation S220: YES), at least one of two or more pre-emphasis control signals may be activated (operation S230), and the drive strength of the at least one of the two or more driving paths may increase based on the activated pre-emphasis control signal such that the first transition time of the output data signal decreases (e.g., such that the first slope of the output data signal increases) (operation S240). In other words, the equalizing operation may be performed on the first edge.

In exemplary embodiments of the inventive concept, as will be described with reference to FIG. 8, each of the two or more driving paths may include a respective one of two or more pre-emphasis driver circuits, and each of the two or more pre-emphasis driver circuits may operate based on a respective one of the two or more pre-emphasis control signals. When a specific pre-emphasis control signal is activated, a corresponding pre-emphasis driver circuit may be enabled, and the drive strength may increase by the enabled pre-emphasis driver circuit. For example, the amount of increment of the drive strength (e.g., the amount of decrement of the first transition time and/or the amount of increment of the first slope) may be determined based on the number and type of the activated pre-emphasis control signals.

When the first edge is not detected (operation S220: NO), for example, when a second edge in which the output data signal is transitioned from the first voltage level to the third voltage level is detected, all of the two or more pre-emphasis control signals may be deactivated, and the drive strength of all of the two or more driving paths may be maintained such that the second transition time of the output data signal is maintained (e.g., such that the second slope of the output data signal is maintained) (operation S250). In other words, the equalizing operation may not be performed on the second edge.

As described above, when the equalizing operation is performed on the first edge, the first transition time may decrease and the first slope may increase as compared to when the equalizing operation is not performed on the first edge. In addition, when the equalizing operation is not performed on the second edge, the second transition time and the second slope may be maintained. Thus, as will be described with reference to FIG. 11A, when the selective equalization scheme is performed according to an exemplary embodiment of the inventive concept, the first transition time and the second transition time may become different from each other.

Although FIG. 2 illustrates an example where the selective equalization scheme is performed only on a single edge (e.g., on the first edge), the inventive concept is not limited thereto, and the selective equalization scheme may be performed on two or more edges as will be described with reference to FIG. 13.

Figure 3:
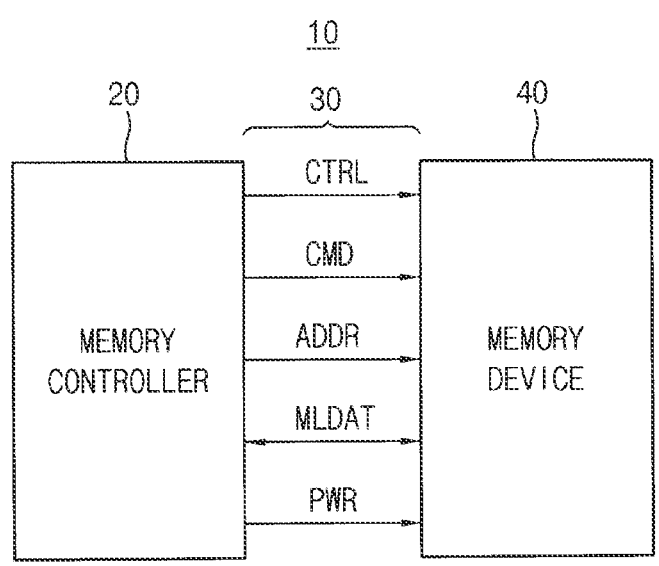
FIG. 3 is a block diagram illustrating a memory system according to an exemplary embodiment of the inventive concept.

FIG. 3 is a block diagram illustrating a memory system according to an exemplary embodiment of the inventive concept.

Referring to FIG. 3, a memory system 10 includes a memory controller 20 and a memory device 40. The memory system 10 may further include a plurality of signal lines 30 that electrically connect the memory controller 20 with the memory device 40.

The memory device 40 is controlled by the memory controller 20. For example, based on requests from a host, the memory controller 20 may store (e.g., write or program) data into the memory device 40, or may retrieve (e.g., read or sense) data from the memory device 40.

The plurality of signal lines 30 may include control lines, command lines, address lines, data input/output (I/O) lines, and power lines. The memory controller 20 may transmit a command CMD, an address ADDR, and a control signal CTRL to the memory device 40 via the command lines, the address lines, and the control lines, respectively, may exchange a data signal MLDAT with the memory device 40 via the data I/O lines, and may transmit a power supply voltage PWR to the memory device 40 via the power lines. For example, the data signal MLDAT may be the multi-level signal that is generated and transmitted according to an exemplary embodiment of the inventive concept. The plurality of signal lines 30 may further include data strobe signal (DQS) lines for transmitting a DQS signal.

In exemplary embodiments of the inventive concept, at least a part or all of the signal lines 30 may be referred to as a channel. The term "channel" as used herein may represent signal lines that include the data I/O lines for transmitting the data signal MLDAT. However, the inventive concept is not limited thereto, and the channel may further include the command lines for transmitting the command CMD and/or the address lines for transmitting the address ADDR.

Figure 4A:
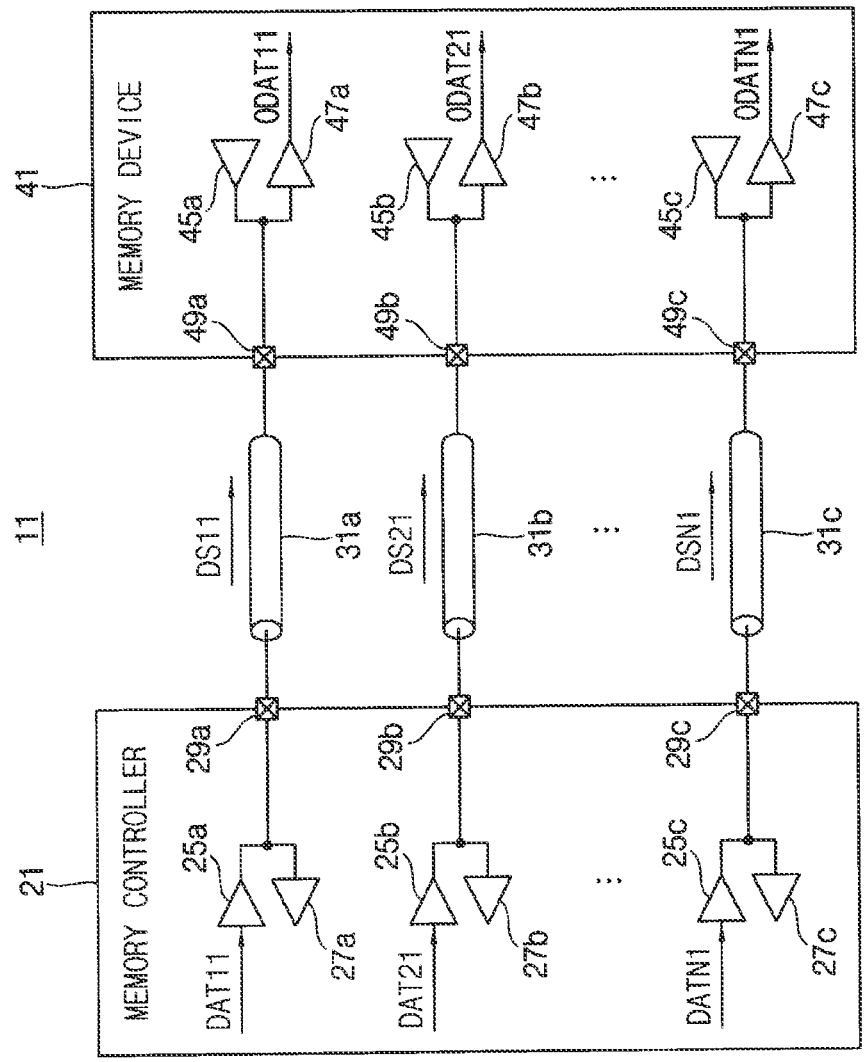
FIGS. 4A and 4B are block diagrams illustrating a memory system according to an exemplary embodiment of the inventive concept.
Figure 4B:
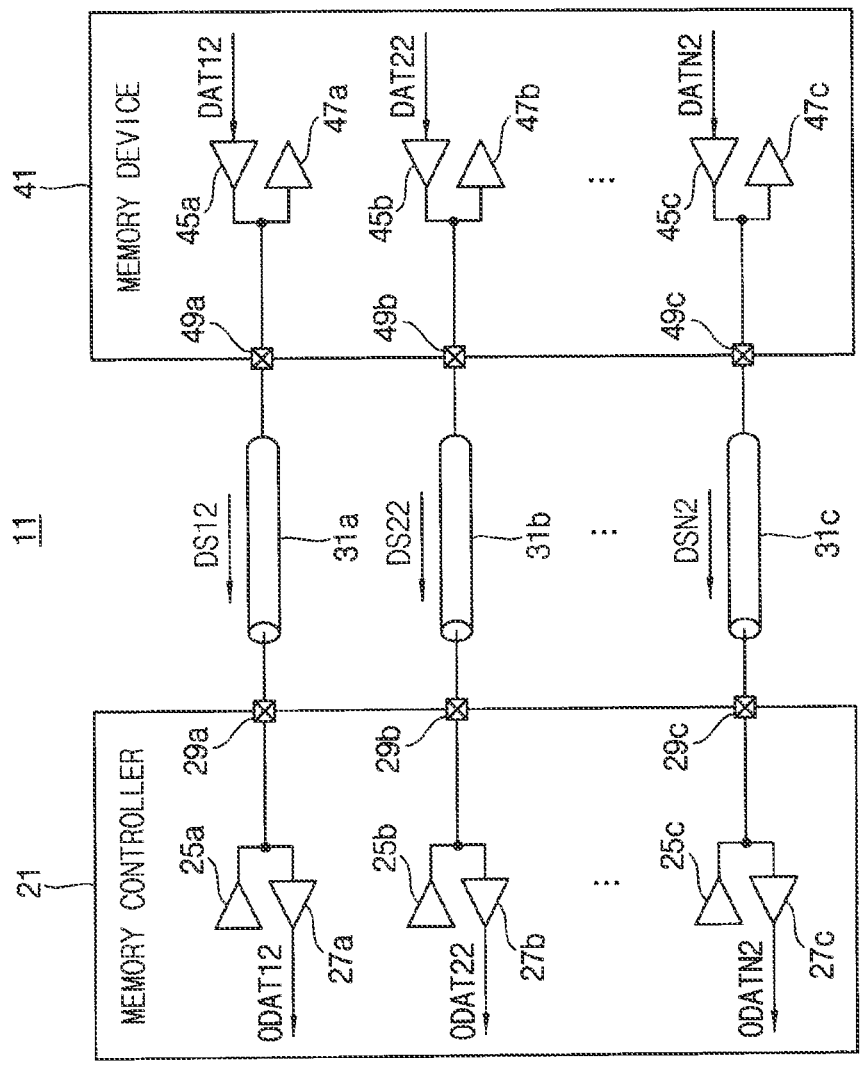

FIGS. 4A and 4B are block diagrams illustrating a memory system according to an exemplary embodiment of the inventive concept.

Referring to FIGS. 4A and 4B, a memory system 11 includes a memory controller 21, a memory device 41, and a plurality of channels 31a, 31b, and 31c. For example, the number of the channels 31a, 31b, and 31c may be N, where N is a natural number greater than or equal to two.

The memory controller 21 may include a plurality of transmitters 25a, 25b, and 25c, a plurality of receivers 27a, 27b, and 27c, and a plurality of data I/O pads 29a, 29b, and 29c. The memory device 41 may include a plurality of transmitters 45a, 45b, and 45c, a plurality of receivers 47a, 47b, and 47c, and a plurality of data I/O pads 49a, 49b, and 49c.

Each of the plurality of transmitters 25a, 25b, 25c, 45a, 45b, and 45c may generate a multi-level signal, may perform the method of generating multi-level signal according to exemplary embodiments of the inventive concept described with reference to FIG. 1, and may be a transmitter according to exemplary embodiments of the inventive concept which will be described with reference to FIGS. 8 and 15. Each of the plurality of receivers 27a, 27b, 27c, 47a, 47b, and 47c may receive the multi-level signal. The plurality of transmitters 25a, 25b, 45a, 45b, and 45c and the plurality of receivers 27a, 27b, 27c, 47a, 47b, and 47c may perform a method of transmitting data according to exemplary embodiments of the inventive concept, which will be described with reference to FIGS. 16 and 17, through the plurality of channels 31a, 31b, and 31c.

Each of the plurality of data I/O pads 29a, 29b, 29c, 49a, 49b, and 49c may be connected to a respective one of the plurality of transmitters 25a, 25b, 25c, 45a, 45b, and 45c and a respective one of the plurality of receivers 27a, 27b, 27c, 47a, 47b, and 47c.

The plurality of channels 31a, 31b, and 31c may connect the memory controller 21 with the memory device 41. Each of the plurality of channels 31a, 31b, and 31c may be connected to a respective one of the plurality of transmitters 25a, 25b, and 25c and a respective one of the plurality of receivers 27a, 27b, and 27c through a respective one of the plurality of data I/O pads 29a, 29b, and 29c. In addition, each of the plurality of channels 31a, 31b, and 31c may be connected to a respective one of the plurality of transmitters 45a, 45b, and 45c and a respective one of the plurality of receivers 47a, 47b, and 47c through a respective one of the plurality of data I/O pads 49a, 49b, and 49c. The multi-level signal may be transmitted through each of the plurality of channels 31a, 31b, and 31c.

FIG. 4A illustrates an operation of transferring data from the memory controller 21 to the memory device 41. For example, the transmitter 25a may generate an output data signal DS11, which is the multi-level signal, based on input data DAT11, the output data signal DS11 may be transmitted from the memory controller 21 to the memory device 41 through the channel 31a, and the receiver 47a may receive the output data signal DS11 to obtain data ODAT11 corresponding to the input data DAT11. Similarly, the transmitter 25b may generate an output data signal DS21, which is the multi-level signal, based on input data DAT21, the output data signal DS21 may be transmitted to the memory device 41 through the channel 31b, and the receiver 47b may receive the output data signal DS21 to obtain data ODAT21 corresponding to the input data DAT21. The transmitter 25c may generate an output data signal DSN1, which is the multi-level signal, based on input data DATN1, the output data signal DSN1 may be transmitted to the memory device 41 through the channel 31c, and the receiver 47c may receive the output data signal DSN1 to obtain data ODATN1 corresponding to the input data DATN1. For example, the input data DAT11, DAT21, and DATN1 may be write data to be written into the memory device 41.

FIG. 4B illustrates an operation of transferring data from the memory device 41 to the memory controller 21. For example, the transmitter 45a may generate an output data signal DS12, which is the multi-level signal, based on input data DAT12, the output data signal DS12 may be transmitted from the memory device 41 to the memory controller 21 through the channel 31a, and the receiver 27a may receive the output data signal DS12 to obtain data ODAT12 corresponding to the input data DAT12. Similarly, the transmitter 45b may generate an output data signal DS22, which is the multi-level signal, based on input data DAT22, the output data signal DS22 may be transmitted to the memory controller 21 through the channel 31b, and the receiver 27b may receive the output data signal DS22 to obtain data ODAT22 corresponding to the input data DAT22. The transmitter 45c may generate an output data signal DSN2, which is the multi-level signal, based on input data DATN2, the output data signal DSN2 may be transmitted to the memory controller 21 through the channel 31c, and the receiver 27c may receive the output data signal DSN2 to obtain data ODATN2 corresponding to the input data DATN2. For example, the input data DAT12, DAT22, and DATN2 may be read data retrieved from the memory device 41.

Figure 5:
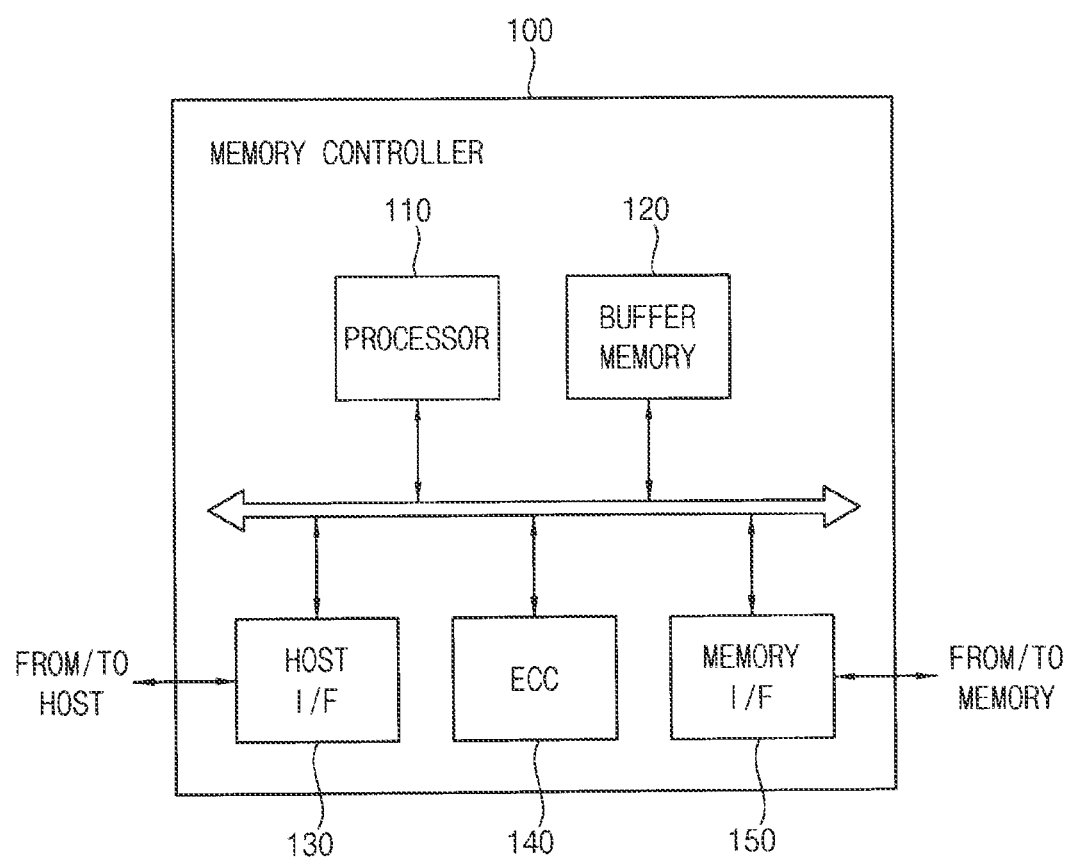
FIG. 5 is a block diagram illustrating a memory controller included in a memory system according to an exemplary embodiment of the inventive concept.

FIG. 5 is a block diagram illustrating a memory controller included in a memory system according to an exemplary embodiment of the inventive concept.

Referring to FIG. 5, a memory controller 100 may include at least one processor 110, a buffer memory 120, a host interface 130, an error correction code (ECC) block 140, and a memory interface 150.

The processor 110 may control an operation of the memory controller 100 in response to a command and/or request received via the host interface 130 from an external host. For example, the processor 110 may control respective components by employing firmware for operating a memory device (e.g., the memory device 40 in FIG. 3).

The buffer memory 120 may store instructions and data executed and processed by the processor 110. For example, the buffer memory 120 may be implemented with a volatile memory device such as a dynamic random access memory (DRAM), a static random access memory (SRAM), a cache memory, or the like.

The host interface 130 may provide physical connections between the external host and the memory controller 100. The host interface 130 may provide an interface corresponding to a bus format of the external host for communication between the external host and the memory controller 100. In exemplary embodiments of the inventive concept, the bus format of the external host may be a small computer system interface (SCSI) or a serial attached SCSI (SAS) interface. In exemplary embodiments of the inventive concept, the bus format of the external host may be a universal serial bus (USB), a peripheral component interconnect (PCI) express (PCIe), an advanced technology attachment (ATA), a parallel ATA (PATA), a serial ATA (SATA), a nonvolatile memory (NVM) express (NVMe), etc., format.

The ECC block 140 for error correction may perform coded modulation using a Bose-Chaudhuri-Hocquenghem (BCH) code, a low-density parity-check (LDPC) code, a turbo code, a Reed-Solomon code, a convolution code, a recursive systematic convolutional code (RSC), a trellis-coded modulation (TCM), a block coded modulation (BCM), etc., or may perform ECC encoding and ECC decoding using the above-described codes or other error correction codes.

The memory interface 150 may exchange data with the memory device. The memory interface 150 may transmit a command and an address to the memory device, and may transmit data to the memory device or receive data read from the memory device. For example, a transmitter (e.g., the transmitter 25*a* in FIG. 4A) that generates the multi-level signal according to an exemplary embodiment of the inventive concept and a receiver (e.g., the receiver 27*a* in FIG. 4A) that receives the multi-level signal may be included in the memory interface 150.

Figure 6:
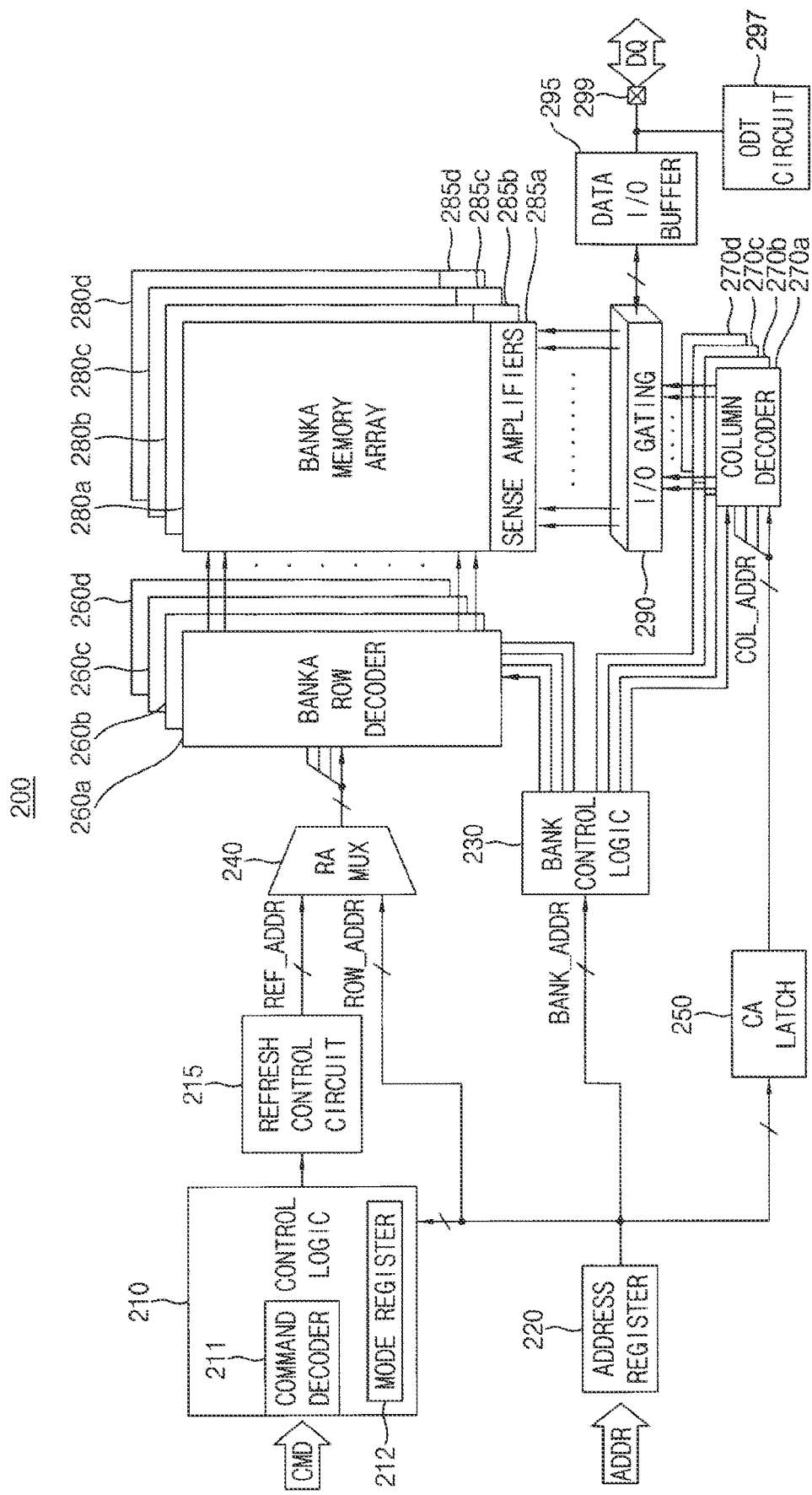
FIG. 6 is a block diagram illustrating a memory device included in a memory system according to an exemplary embodiment of the inventive concept.

FIG. 6 is a block diagram illustrating a memory device included in a memory system according to an exemplary embodiment of the inventive concept.

Referring to FIG. 6, a memory device 200 includes a control logic 210, a refresh control circuit 215, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295, an on-die termination (ODT) circuit 297, and a data I/O pad 299. In exemplary embodiments of the inventive concept, the memory device 200 may be, e.g., a volatile memory device. For example, the memory device 200 may be one of various volatile memory devices such as a dynamic random access memory (DRAM).

The memory cell array may include a plurality of memory cells. The memory cell array may include a plurality of bank arrays, e.g., first through fourth bank arrays 280*a*, 280*b*, 280*c*, and 280*d*. The row decoder may include a plurality of bank row decoders, e.g., first through fourth bank row decoders 260*a*, 260*b*, 260*c*, and 260*d* connected to the first through fourth bank arrays 280*a*, 280*b*, 280*c*, and 280*d*, respectively. The column decoder may include a plurality of bank column decoders, e.g., first through fourth bank column decoders 270*a*, 270*b*, 270*c*, and 270*d* connected to the first through fourth bank arrays 280*a*, 280*b*, 280*c*, and 280*d*, respectively. The sense amplifier unit may include a plurality of bank sense amplifiers, e.g., first through fourth bank sense amplifiers 285*a*, 285*b*, 285*c*, and 285*d* connected to the first through fourth bank arrays 280*a*, 280*b*, 280*c*, and 280*d*, respectively.

The first through fourth bank arrays 280*a*~280*d*, the first through fourth bank row decoders 260*a*~260*d*, the first through fourth bank column decoders 270*a*~270*d*, and the first through fourth bank sense amplifiers 285*a*~285*d* may form first through fourth banks, respectively. For example, the first bank array 280*a*, the first bank row decoder 260*a*, the first bank column decoder 270*a*, and the first bank sense amplifier 285*a* may form the first bank; the second bank array 280*b*, the second bank row decoder 260*b*, the second bank column decoder 270*b*, and the second bank sense amplifier 285*b* may form the second bank; the third bank array 280*c*, the third bank row decoder 260*c*, the third bank column decoder 270*c*, and the third bank sense amplifier 285*c* may form the third bank; and the fourth bank array 280*d*, the fourth bank row decoder 260*d*, the fourth bank column decoder 270*d*, and the fourth bank sense amplifier 285*d* may form the fourth bank.

The address register 220 may receive the address ADDR including a bank address BANK_ADDR, a row address ROW_ADDR, and a column address COL_ADDR from a memory controller (e.g., the memory controller 20 in FIG. 3). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to receipt of the bank address BANK_ADDR. One of the first through fourth bank row decoders 260*a*~260*d* corresponding to the received bank address BANK_ADDR may be activated in response to the bank control signals generated by the bank control logic 230, and one of the first through fourth bank column decoders 270*a*~270*d* corresponding to the received bank address BANK_ADDR may be activated in response to the bank control signals generated by the bank control logic 230.

The refresh control circuit 215 may generate a refresh address REF_ADDR in response to receipt of a refresh command or entrance of any self-refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260*a*~260*d*.

The activated one of the first through fourth bank row decoders 260*a*~260*d* may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a~270d.

The activated one of the first through fourth bank column decoders 270a~270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, the I/O gating circuit 290 may include an input data mask logic, read data latches for storing data output from the first through fourth bank arrays 280a~280d, and write drivers for writing data to the first through fourth bank arrays 280a~280d.

Data DQ to be read from one of the first through fourth bank arrays 280a~280d may be sensed by a sense amplifier coupled to the one bank array, and may be stored in the read data latches. The data DQ stored in the read data latches may be provided to the memory controller via the data I/O buffer 295 and the data I/O pad 299. Data DQ received via the data I/O pad 299 that are to be written to one of the first through fourth bank arrays 280a~280d may be provided from the memory controller to the data I/O buffer 295. The data DQ received via the data I/O pad 299 and provided to the data I/O buffer 295 may be written to the one bank array via the write drivers in the I/O gating circuit 290. For example, a transmitter (e.g., the transmitter 45a in FIG. 4A) that generates the multi-level signal according to an exemplary embodiment of the inventive concept and a receiver (e.g., the receiver 47a in FIG. 4A) that receives the multi-level signal may be included in the data I/O buffer 295.

The control logic 210 may control an operation of the memory device 200. For example, the control logic 210 may generate control signals for the memory device 200 to perform a data write operation or a data read operation. The control logic 210 may include a command decoder 211 that decodes the command CMD received from the memory controller and a mode register 212 that sets an operation mode of the memory device 200.

The ODT circuit 297 may be connected to the data I/O pad 299 and the data I/O buffer 295. When the ODT circuit 297 is enabled, an ODT operation may be performed. The ODT operation may reduce (and/or prevent) a signal from being reflected by using a termination resistor to improve signal integrity.

Although the memory device included in the memory system according to an exemplary embodiment of the inventive concept is described based on a DRAM, the memory device may be any volatile memory device and/or any nonvolatile memory device, e.g., a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Hereinafter, exemplary embodiments of the inventive concept will be described in detail based on various examples of the multi-level signaling scheme (e.g., the PAM scheme) and various examples of the transmitter according thereto.

Figure 7A:
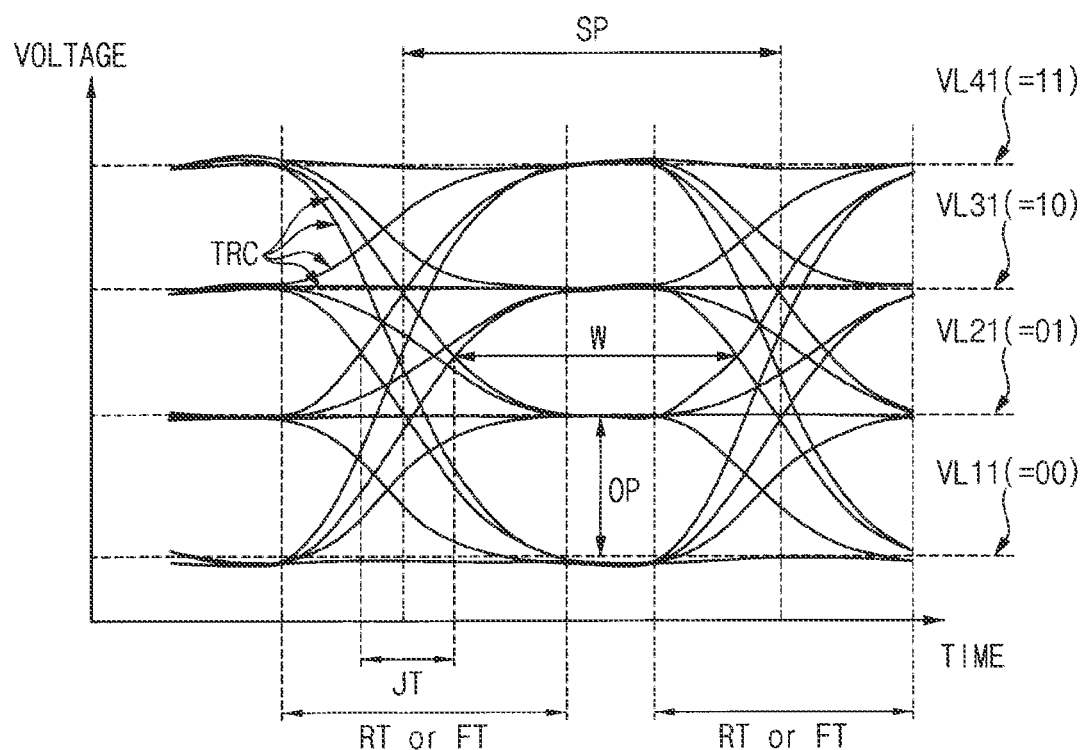
FIGS. 7A, 7B, and 7C are diagrams for describing a data signal generated by a method of generating a multi-level signal according to an exemplary embodiment of the inventive concept.
Figure 7B:
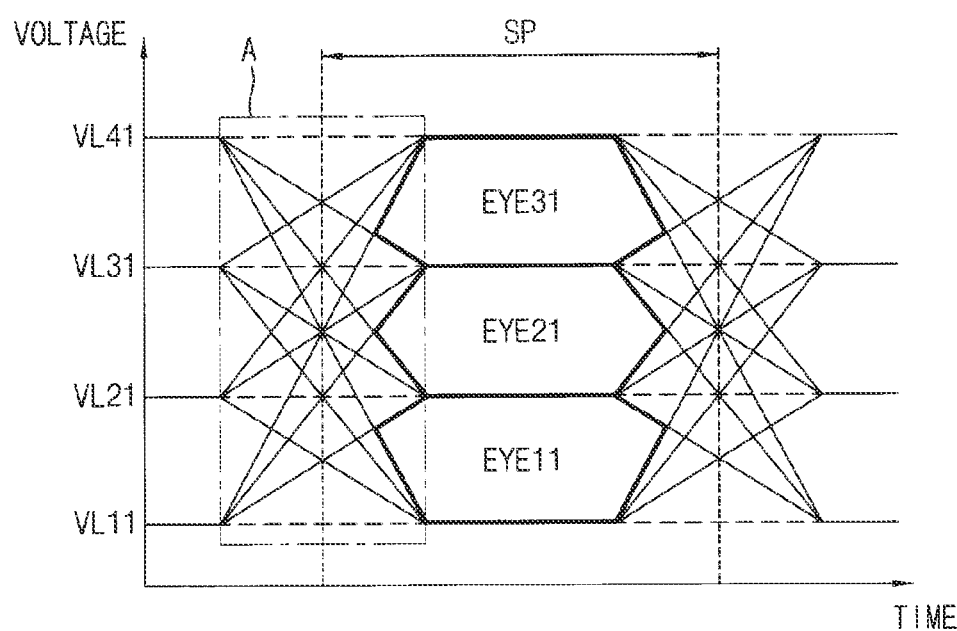
Figure 7C:
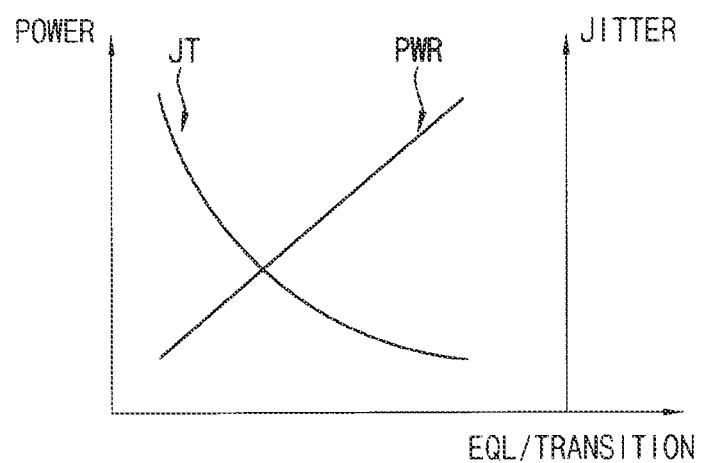

FIGS. 7A, 7B, and 7C are diagrams for describing a data signal generated by a method of generating a multi-level signal according to an exemplary embodiment of the inventive concept.

FIG. 7A illustrates an ideal eye diagram of a data signal (e.g., a PAM4 signal) generated based on the 4-level scheme (e.g., the PAM4 scheme). FIG. 7B is a simplified diagram illustrating the eye diagram of FIG. 7A. FIG. 7C is a diagram illustrating the selective equalization scheme according to an exemplary embodiment of the inventive concept.

Referring to FIG. 7A, an eye diagram may be used to indicate the quality of signals in high-speed transmissions. For example, the eye diagram may represent four symbols of a signal (e.g., '00,' '01,' '10,' and '11'), and each of the four symbols may be represented by a respective one of different voltage levels (e.g., voltage amplitudes) VL11, VL21, VL31, and VL41. The eye diagram may be used to provide a visual indication of the health of the signal integrity, and may indicate noise margins of the data signal.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form a plurality of traces TRC. Various characteristics associated with the measured signal may be determined by overlaying the plurality of traces TRC.

The eye diagram may be used to identify a number of characteristics of a communication signal such as jitter, crosstalk, electromagnetic interference (EMI), signal loss, signal-to-noise ratio (SNR), other characteristics, or combinations thereof.

For example, a width W of an eye in the eye diagram may be used to indicate a timing synchronization of the measured signal or jitter effects of the measured signal. For example, the eye diagram may indicate an eye opening OP, which represents a peak-to-peak voltage difference between various voltage levels VL11, VL21, VL31, and VL41. The eye opening OP may be related to a voltage margin for discriminating between different voltage levels VL11, VL21, VL31, and VL41 of the measured signal. For example, the eye diagram may be used to identify a rise time RT and/or a fall time FT for transitions from a first amplitude to a second amplitude. The rise time RT or the fall time FT may indicate a time for transitioning from one voltage level to another voltage level, may be related to or associated with a rising edge and a falling edge, respectively, and may correspond to the first and second transition times described with reference to FIG. 1. The slope of the trace TRC during the rise time RT or the fall time FT may indicate the sensitivity of the signal to timing error, among other aspects.

For example, the eye diagram may be used to identify an amount of jitter JT in the measured signal. The jitter JT may refer to a timing error that results from a misalignment of rise and fall times. The jitter JT may occur when the rising edge or the falling edge occurs at a time that is different from an ideal time defined by the data clock. The jitter JT may be caused by signal reflections, intersymbol interference, crosstalk, process-voltage-temperature (PVT) variations, random jitter, additive noise, or combinations thereof.

Referring to FIG. 7B, different first, second, third, and fourth voltage levels VL11, VL21, VL31, and VL41 of the data signal that is the PAM4 signal are illustrated, and first, second, and third eyes EYE11, EYE21, and EYE31 of the data signal are illustrated. The parts illustrated by the thick solid lines represent the size of the eyes EYE11, EYE21, and EYE31.

The first voltage level VL11 may be lower than the second voltage level VL21, the second voltage level VL21 may be lower than the third voltage level VL31, and the third voltage level VL31 may be lower than the fourth voltage level VL41. In addition, the first eye EYE11 may be positioned between the first and second voltage levels VL11 and VL21, the second eye EYE21 may be positioned between the second and third voltage levels VL21 and VL31, and the third eye EYE31 may be positioned between the third and fourth voltage levels VL31 and VL41.

Not all edges may affect the characteristics of the eyes EYE11, EYE21, and EYE31. In other words, only some edges may affect the characteristics of the eyes EYE11, EYE21, and EYE31. For example, the characteristic of the first eye EYE11 may be determined by a falling edge (e.g., '11'→'00') from the fourth voltage level VL41 to the first voltage level VL11, a rising edge (e.g., '00'→'01') from the first voltage level VL11 to the second voltage level VL21, a rising edge (e.g., '00'→'11') from the first voltage level VL11 to the fourth voltage level VL41, and a falling edge (e.g., '01'→'00') from the second voltage level VL21 to the first voltage level VL11. Similarly, the characteristic of the second eye EYE21 may be determined by rising and falling edges (e.g., '01'<→'11') between the second and fourth voltage levels VL21 and VL41, and rising and falling edges (e.g., '00'<→'10') between the first and third voltage levels VL11 and VL31. The characteristic of the third eye EYE31 may be determined by rising and falling edges (e.g., '10'<→'11') between the third and fourth voltage levels VL31 and VL41, and rising and falling edges (e.g., '00'<→'11') between the first and fourth voltage levels VL11 and VL41.

When the equalizing operation is performed on all edges (e.g., all level transitions), the equalizing operation may also be performed on edges that do not affect the eye characteristics. The equalizing operation that is not appropriate for the eye characteristics may cause unnecessary power consumption, and may deteriorate or degrade the eye characteristics in some cases. On the other hand, when the equalizing operation is performed only on some edges (e.g., some level transitions) according to exemplary embodiments of the inventive concept, power consumption may be reduced and the signal characteristic may be efficiently improved or enhanced.

Referring to FIG. 7C, the change in the power consumption and the amount of jitter according to the number of times of equalizing operations is illustrated as a graph. A horizontal axis represents the number of times of equalizing operations are performed (EQL) or the number of level transitions in which the equalizing operation is performed. Vertical axes represent the power consumption (PWR) and the amount of jitter (JT).

As the number of times the equalizing operations are performed increases, the power consumption may increase, and the amount of jitter may decrease to improve the jitter characteristics. The target and number of the equalizing operations may be set in consideration of the power consumption and characteristics of channels through which data signals are transmitted, and thus the selective equalization scheme may be implemented for optimal performance.

Figure 8:
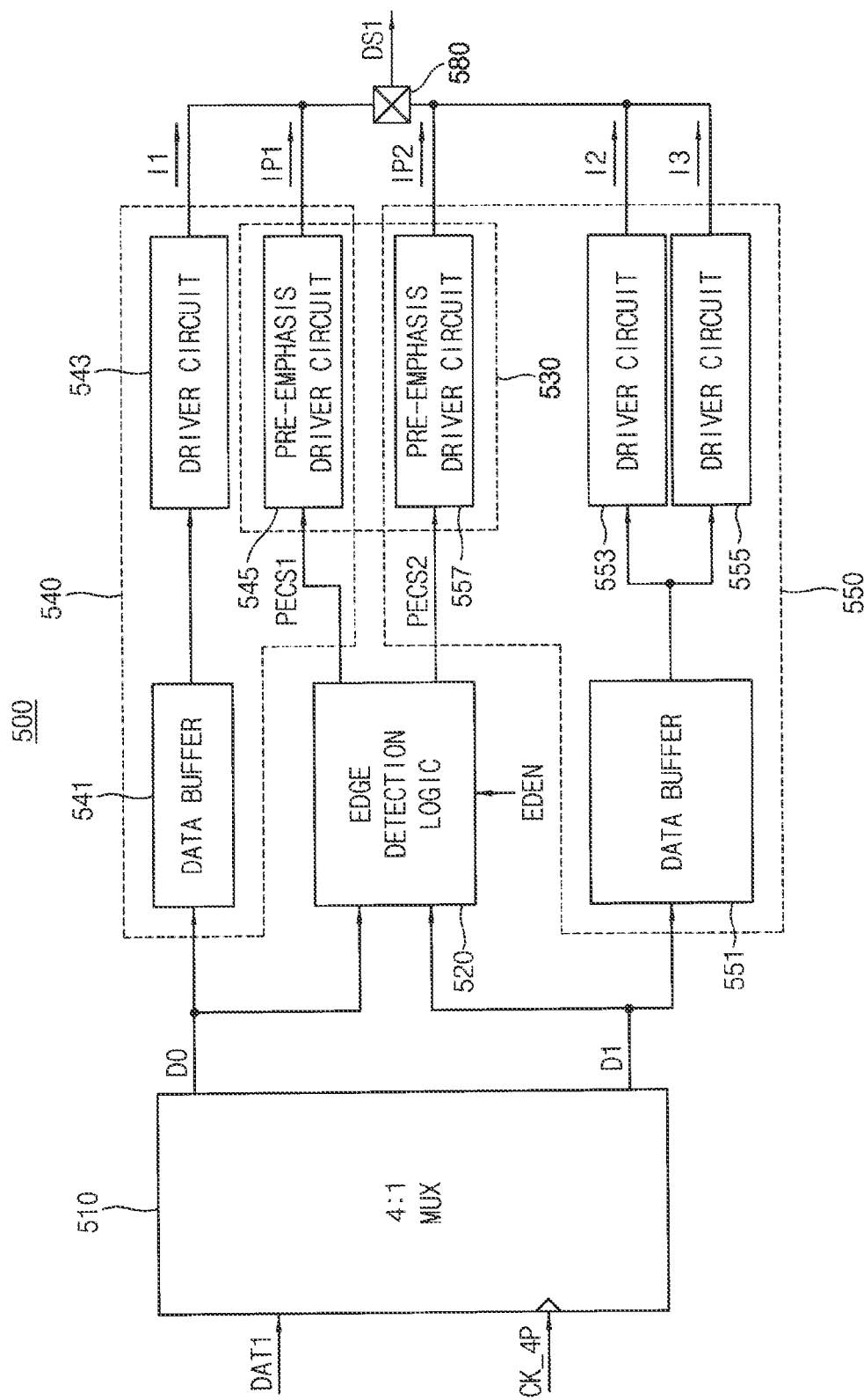
FIG. 8 is a block diagram illustrating a transmitter according to an exemplary embodiment of the inventive concept.

FIG. 8 is a block diagram illustrating a transmitter according to an exemplary embodiment of the inventive concept.

Referring to FIG. 8, a transmitter 500 includes a multiplexer 510, an edge detection logic 520, and two or more driving paths 540 and 550. The transmitter 500 may further include a data I/O pad 580. According to an exemplary embodiment of the inventive concept, the edge detection logic 520 may be a circuit.

The multiplexer 510 receives input data DAT1 including two or more bits D0 and D1, and divides the input data DAT1 into the two or more bits D0 and D1. The edge detection logic 520 detects a first edge based on the two or more bits D0 and D1, and activates at least one of two or more pre-emphasis control signals PECS1 and PECS2 when the first edge is detected. The first edge represents an edge in which an output data signal DS1 is transitioned from a first voltage level to a second voltage level. The two or more driving paths 540 and 550 generate the output data signal DS1 that is a multi-level signal based on the two or more bits D0 and D1 and the two or more pre-emphasis control signals PECS1 and PECS2. The data I/O pad 580 may output the output data signal DS1.

When the first edge is detected, the output data signal DS1 is generated by changing a drive strength of at least one of the two or more driving paths 540 and 550 such that a first transition time, during which the output data signal DS1 is transitioned from the first voltage level to the second voltage level, is changed. A second transition time, during which the output data signal DS1 is transitioned from the first voltage level to a third voltage level different from the second voltage level, is maintained. In other words, the transmitter 500 may perform the method of generating the multi-level signal according to an exemplary embodiment of the inventive concept.

The edge detection logic 520 may be set to detect the first edge among a plurality of edges included in the output data signal DS1 based on a plurality of edge detection enable signals EDEN. In other words, the first and second voltage levels may be determined based on the plurality of edge detection enable signals EDEN. In exemplary embodiments of the inventive concept, the plurality of edge detection enable signals EDEN may be preset (or set in advance), and the first and second voltage levels may be predetermined (or determined in advance) based on a characteristic of a channel transmitting the output data signal DS1. In exemplary embodiments of the inventive concept, the plurality of edge detection enable signals EDEN may be set in real time (or during runtime), and the first and second voltage levels may be determined in real time based on characteristic data that represents the characteristic of the channel transmitting the output data signal DS1 and is received from outside. For example, as will be described with reference to FIGS. 18A and 18B, the characteristic data may be provided from an eye monitor circuit included in a receiver that receives the output data signal DS1.

In the example of FIG. 8, the input data DAT1 may include a first bit D0 and a second bit D1 that are different from each other, and the multiplexer 510 may divide the input data DAT1 into the first bit D0 and the second bit D1 based on a four-phase clock signal CK_4P. The two or more driving paths 540 and 550 may include a first driving path 540 that operates based on the first bit D0 and a first pre-emphasis control signal PECS1, and a second driving path 550 that operates based on the second bit D1 and a second pre-emphasis control signal PECS2. The output data signal DS1 may correspond to the data signal illustrated in FIGS. 7A and 7B, and may have one of the first, second, third and fourth voltage levels VL11, VL21, VL31, and VL41, that are different from each other, during one unit interval.

In exemplary embodiments of the inventive concept, the first bit D0 may be a least significant bit (LSB) of the input data DAT1, and the second bit D1 may be a most significant bit (MSB) of the input data DAT1. The first driving path 540 may be a data path for the LSB, and the second driving path 550 may be a data path for the MSB.

The first driving path 540 may include a first data buffer 541, a first driver circuit 543, and a first pre-emphasis driver circuit 545. The first data buffer 541 may temporarily store the first bit D0. The first driver circuit 543 may generate a first driving current I1 for generating the output data signal DS1 based on an output of the first data buffer 541. The first pre-emphasis driver circuit 545 may generate a first current IP1 for increasing a first drive strength of the first driving path 540 based on the first pre-emphasis control signal PECS1.

The second driving path 550 may include a second data buffer 551, a second driver circuit 553, a third driver circuit 555, and a second pre-emphasis driver circuit 557. The second data buffer 551 may temporarily store the second bit D1. The second driver circuit 553 may generate a second driving current I2 for generating the output data signal DS1 based on an output of the second data buffer 551. The third driver circuit 555 may generate a third driving current I3 for generating the output data signal DS1 based on the output of the second data buffer 551. The second pre-emphasis driver circuit 557 may generate a second current IP2 for increasing a second drive strength of the second driving path 550 based on the second pre-emphasis control signal PECS2.

The second and third driver circuits 553 and 555 may be substantially simultaneously enabled or disabled based on the output of the second data buffer 551. The second driving path 550 that is the data path for the MSB should have a greater driving capability than the first driving path 540 that is the data path for the LSB. Thus, the second driving path 550 may include more driver circuits than the first driving path 540, e.g., two driver circuits 553 and 555 that are enabled/disabled at substantially the same time.

Accordingly, the first and second driving paths 540 and 550 generate the output data signal DS1 that is the multi-level signal based on the driving currents (e.g., I1, I2, and I3) generated by the driver circuits (e.g., 543, 553, and 555) and the first and second currents (e.g., IP1 and IP2) generated by the first and second pre-emphasis driver circuits (e.g., 545 and 557).

The drive strength of at least one of the first and second driving paths 540 and 550 is changed by activating the first pre-emphasis control signal PECS1 applied to the first driving path 540 to increase a first drive strength of the first driving path 540, or by activating the second pre-emphasis control signal PECS2 applied to the second driving path 550 to increase a second drive strength of the second driving path 550.

"Pre-emphasis" is a type of equalizing operation. Pre-emphasizing a signal may include boosting the high-frequency components of the signal to compensate for attenuation incurred in the channel. Generally, "pre-emphasis" refers to increasing a signal amplitude after a transition of the signal. The pre-emphasis in this context may be accomplished by amplifying the high frequency components of the signal (e.g., increasing the energy content of the high frequency components to compensate for degradation of those components due to channel loss), which increases the overall amplitude of the signal. In addition, a drive strength of a signal indicates a voltage or current of the signal, and for example, the drive strength of the signal may increase when the pre-emphasis is performed. Although the equalizing operation according to an exemplary embodiment of the inventive concept is described based on pre-emphasis, the equalizing operation is not limited thereto.

In exemplary embodiments of the inventive concept, at least one pre-driver circuit may be disposed between the data buffers 541 and 551 and the driver circuits 543, 553, and 555, and/or between the edge detection logic 520 and the pre-emphasis driver circuits 545 and 557. The pre-driver circuit may condition or modify the received signal before passing it to the next stage (e.g., the pre-driver may modify the received signal to improve the characteristics or quality of the communication signal). The pre-driver circuit may additionally or alternatively act as a selector.

Although FIG. 8 illustrates that a configuration 530 for increasing the drive strength includes one pre-emphasis driver circuit 545 included in the first driving path 540 and one pre-emphasis driver circuit 557 included in the second driving path 550, the inventive concept is not limited thereto, and the number of pre-emphasis driver circuits may be changed. Similarly, the number of the driver circuits 543, 553, and 555 may also be changed, and the number of the driver circuits 543, 553, and 555 and the number of the pre-emphasis driver circuits 545 and 557 may be equal to or different from each other.

FIG. 9 is a block diagram illustrating an edge detection logic included in the transmitter of FIG. 8 according to an exemplary embodiment of the inventive concept.

Referring to FIG. 9, the edge detection logic 520 may include a plurality of edge detection circuits 521, 522, 523, 524, 525, 526, 531, 532, 533, 534, 535, and 536.

The edge detection circuits 521, 522, 523, 524, 525, and 526 may be selectively enabled based on edge detection enable signals EDEN_R1, EDEN_R2, EDEN_R3, EDEN_R4, EDEN_R5, and EDEN_R6, respectively. When each of the edge detection circuits 521, 522, 523, 524, 525, and 526 is enabled, each of the edge detection circuits 521, 522, 523, 524, 525, and 526 may detect a respective rising edge of the output data signal DS1 based on the first and second bits D0 and D1 to activate at least one of the pre-emphasis control signals PECS1 and PECS2. For example, the edge detection circuit 521 may be enabled based on the edge detection enable signal EDEN_R1. For example, when the edge detection circuit 521 is enabled, the edge detection circuit 521 may detect a first rising edge (e.g., '00'→'11') in which the output data signal DS1 is transitioned from the first voltage level VL11 that is the lowest voltage level to the fourth voltage level VL41 that is the highest voltage level. For example, when the first rising edge is detected by the edge detection circuit 521, the edge detection circuit 521 may activate both of the pre-emphasis control signals PECS1 and PECS2.

The edge detection circuits 531, 532, 533, 534, 535, and 536 may be selectively enabled based on edge detection enable signals EDEN_F1, EDEN_F2, EDEN_F3, EDEN_F4, EDEN_F5, and EDEN_F6, respectively. When each of the edge detection circuits 531, 532, 533, 534, 535, and 536 is enabled, each of the edge detection circuits 531, 532, 533, 534, 535 and 536 may detect a respective falling edge of the output data signal DS1 based on the first and second bits D0 and D1 to activate at least one of the pre-emphasis control signals PECS1 and PECS2. For example, the edge detection circuit 531 may be enabled based on the edge detection enable signal EDEN_F1. For example, when the edge detection circuit 531 is enabled, the edge detection circuit 531 may detect a first falling edge (e.g., '11'→'00') in which the output data signal DS1 is transitioned from the fourth voltage level VL41 to the first voltage level VL11. For example, when the first falling edge is detected by the edge detection circuit 531, the edge detection circuit 531 may activate both of the pre-emphasis control signals PECS1 and PECS2.

In exemplary embodiments of the inventive concept, when the output data signal DS1 is transitioned from one of the lowest voltage level (e.g., the first voltage level VL11) and the highest voltage level (e.g., the fourth voltage level VL41) to the other of the lowest voltage level and the highest voltage level, both of two pre-emphasis control signals PECS1 and PECS2 may be activated. In other cases, only one of the pre-emphasis control signals PECS1 and PECS2 may be activated.

Figure 10A:
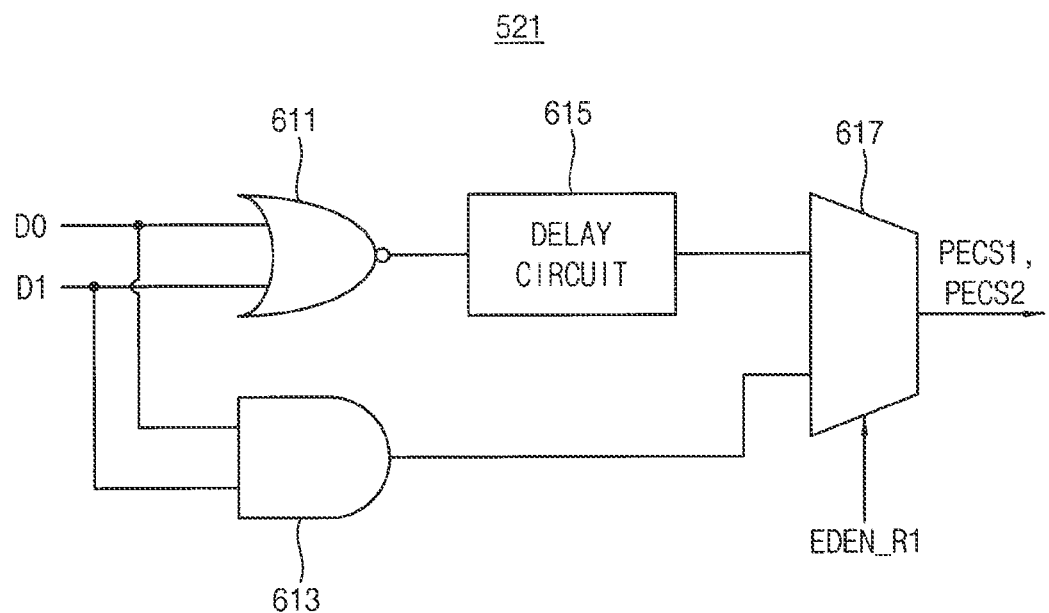
FIGS. 10A and 10B are block diagrams illustrating an edge detection circuit included in the edge detection logic of FIG. 9 according to exemplary embodiments of the inventive concept.
Figure 10B:
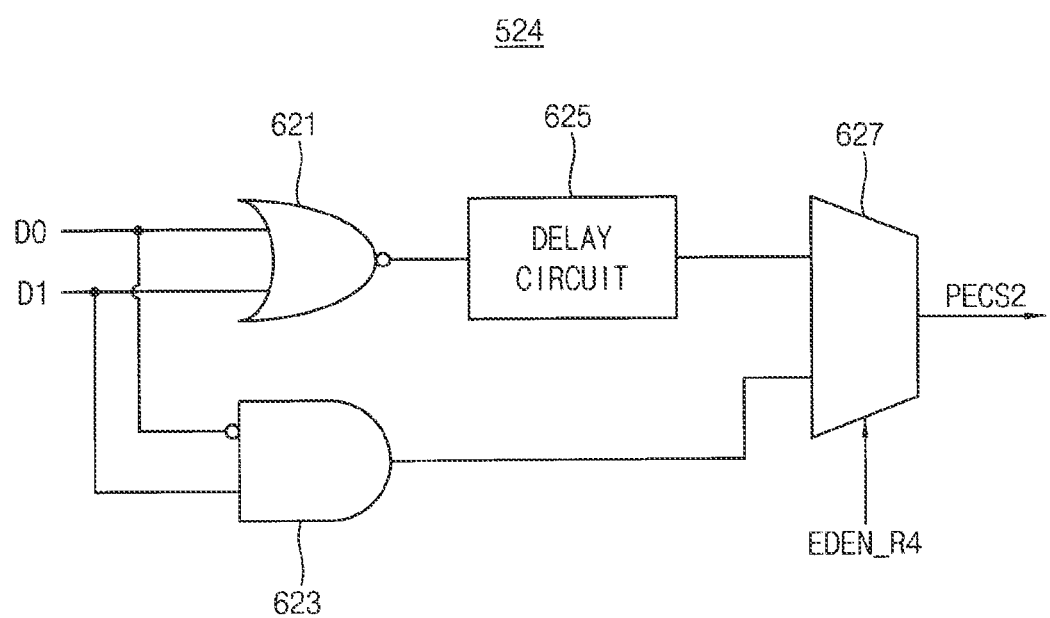

FIGS. 10A and 10B are block diagrams illustrating an edge detection circuit included in the edge detection logic of FIG. 9 according to exemplary embodiments of the inventive concept.

Referring to FIG. 10A, the edge detection circuit 521 may include a NOR gate 611, an AND gate 613, a delay circuit 615, and a multiplexer 617.

The NOR gate 611 may perform a NOR operation on the first and second bits D0 and D1. The AND gate 613 may perform an AND operation on the first and second bits D0 and D1. The delay circuit 615 may delay an output of the NOR gate 611. The multiplexer 617 may output one of an output of the delay circuit 615 and an output of the AND gate 613 as the first and second pre-emphasis control signals PECS1 and PECS2 based on the edge detection enable signal EDEN_R1. For example, the multiplexer 617 may output the output of the delay circuit 615 when the edge detection enable signal EDEN_R1 is activated, and may output the output of the AND gate 613 when the edge detection enable signal EDEN_R1 is deactivated. In addition, when the edge detection enable signal EDEN_R1 is activated and when the first rising edge, in which the output data signal DS1 is transitioned from the first voltage level VL11 to the fourth voltage level VL41, is detected, the multiplexer 617 may output the activated first and second pre-emphasis control signals PECS1 and PECS2.

Referring to FIG. 10B, the edge detection circuit 524 may include a NOR gate 621, an AND gate 623, a delay circuit 625, and a multiplexer 627. The descriptions of elements already described with reference to FIG. 10A will be omitted.

The NOR gate 621 and the delay circuit 625 may be substantially the same as the NOR gate 611 and the delay circuit 615 in FIG. 10A, respectively. The AND gate 623 may perform an AND operation on an inverted bit of the first bit D0 and the second bit D1. The multiplexer 627 may output one of an output of the delay circuit 625 and an output of the AND gate 623 as the second pre-emphasis control signal PECS2 based on the edge detection enable signal EDEN_R4. For example, when the edge detection enable signal EDEN_R4 is activated and when a fourth rising edge, in which the output data signal DS1 is transitioned from the second voltage level VL21 to the fourth voltage level VL41, is detected, the multiplexer 627 may output the activated second pre-emphasis control signal PECS2. In the edge detection circuit 524, the first pre-emphasis control signal PECS1 may not be generated or may always be deactivated.

The remaining edge detection circuits 522, 523, 525, 526, 531, 532, 533, 534, 535, and 536 may also be implemented to detect corresponding edges, and may have configurations similar to those of FIGS. 10A and 10B.

FIGS. 11A, 11B, 11C, 11D, 11E, and 12 are diagrams for describing operations performed by a method of generating a multi-level signal and a transmitter according to an exemplary embodiment of the inventive concept.

FIGS. 11A, 11B, 11C, 11D, and 11E are enlarged views of a portion 'A' in FIG. 7B. In FIGS. 11A, 11B, 11C, 11D, and 11E, a graph on the left illustrates a case in which the selective equalization scheme according to an exemplary embodiment of the inventive concept is not applied, and a graph on the right illustrates a case in which the selective equalization scheme according to an exemplary embodiment of the inventive concept is applied.

Figure 11A:
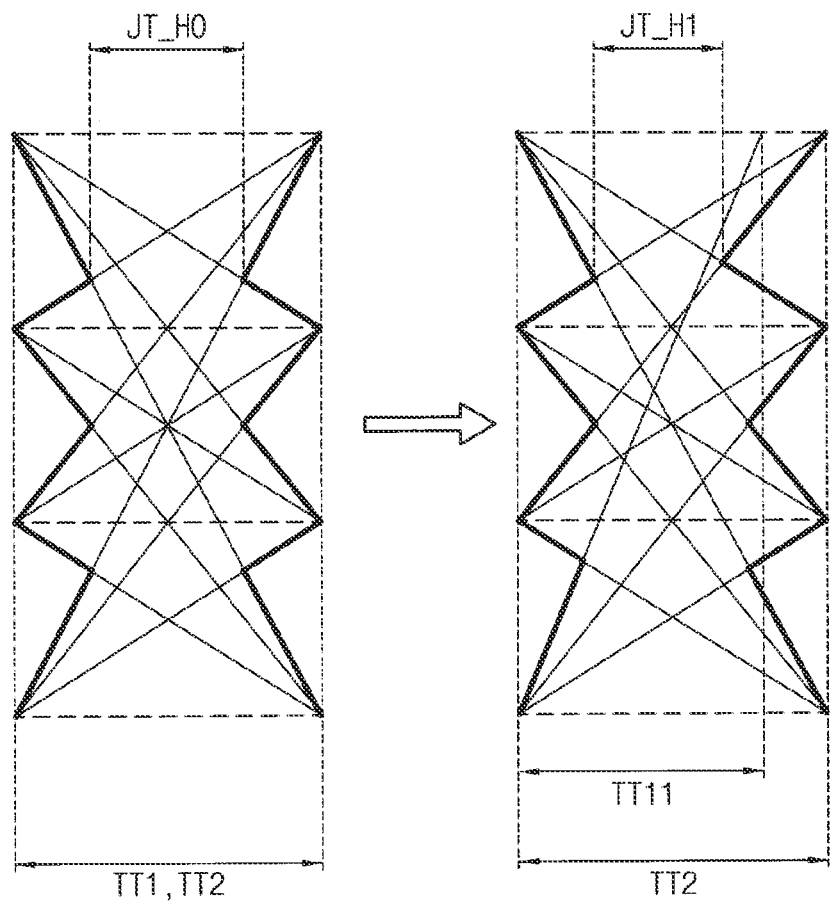
FIGS. 11A, 11B, 11C, 11D, 11E, and 12 are diagrams for describing operations performed by a method of generating a multi-level signal and a transmitter according to an exemplary embodiment of the inventive concept.

Referring to FIG. 11A, in the case on the left, all edges may have the same transition time TT1 and TT2. In the case on the right, the edge detection circuit 521 may be enabled, a slope of the first rising edge (e.g., '00'→'11') transitioning from the first voltage level VL11 to the fourth voltage level VL41 may increase, and a transition time of the first rising edge may decrease from TT1 to TT11. Thus, the jitter characteristic of the eye EYE31 may be improved from JT_H0 to JT_H1.

Figure 11B:
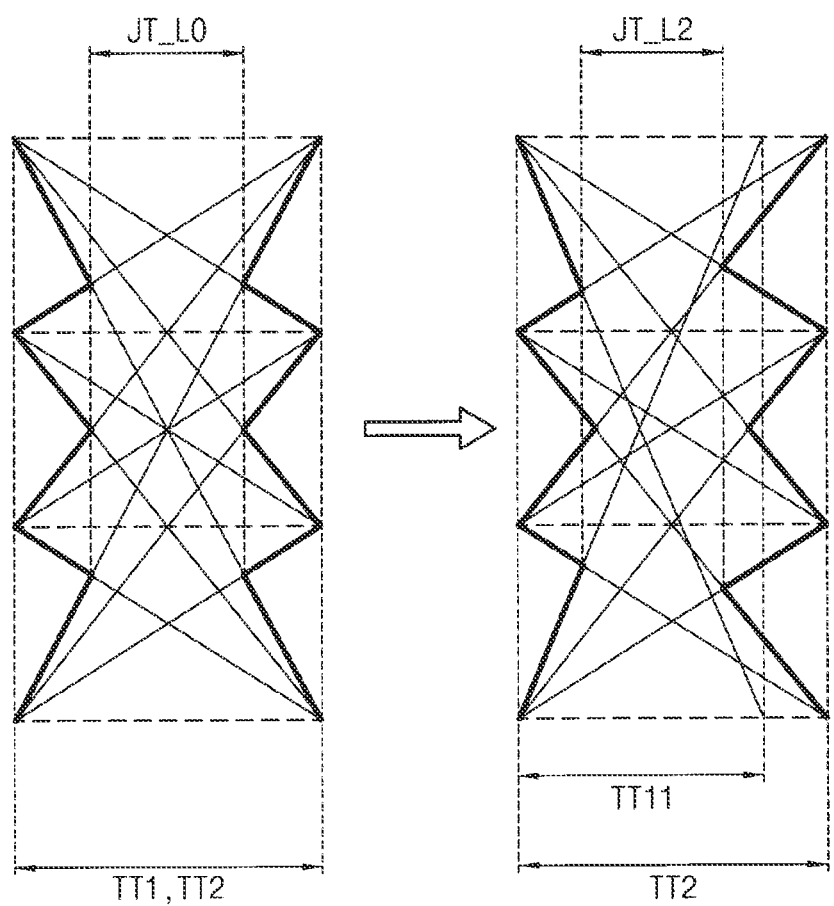

Referring to FIG. 11B, in the case on the right in FIG. 11B as compared to the case on the right in FIG. 11A, the edge detection circuit 527 may be additionally enabled, a slope of the first falling edge (e.g., '11'→'00') transitioning from the fourth voltage level VL41 to the first voltage level VL11 may further increase, and a transition time of the first falling edge may further decrease. Thus, the jitter characteristic of the eye EYE11 may be further improved from JT_L0 to JT_L2.

Figure 11C:
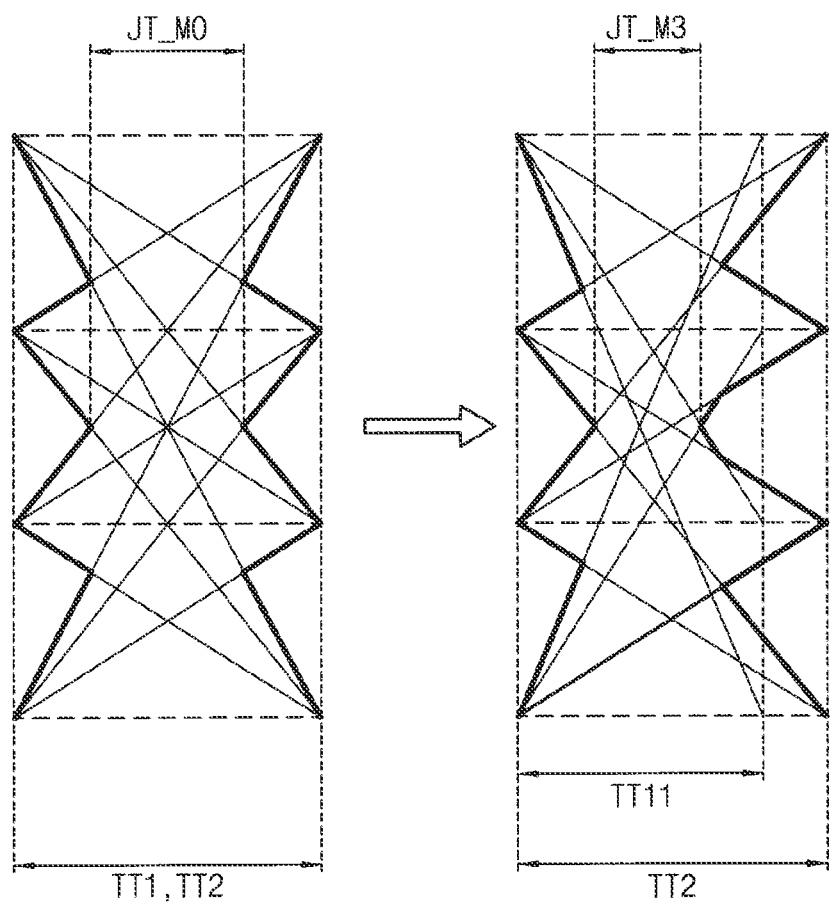

Referring to FIG. 11C, in the case on the right in FIG. 11C as compared to the case on the right in FIG. 11B, the edge detection circuits 522 and 532 may be additionally enabled. As such, slopes of a second rising edge (e.g., '00'→'10') transitioning from the first voltage level VL11 to the third voltage level VL31 and a second falling edge (e.g., '11'→'01') transitioning from the fourth voltage level VL41 to the second voltage level VL21 may further increase, and transition times of the second rising edge and the second falling edge may further decrease. Thus, the jitter characteristic of the eye EYE21 may be further improved from JT_M0 to JT_M3.

Figure 11D:
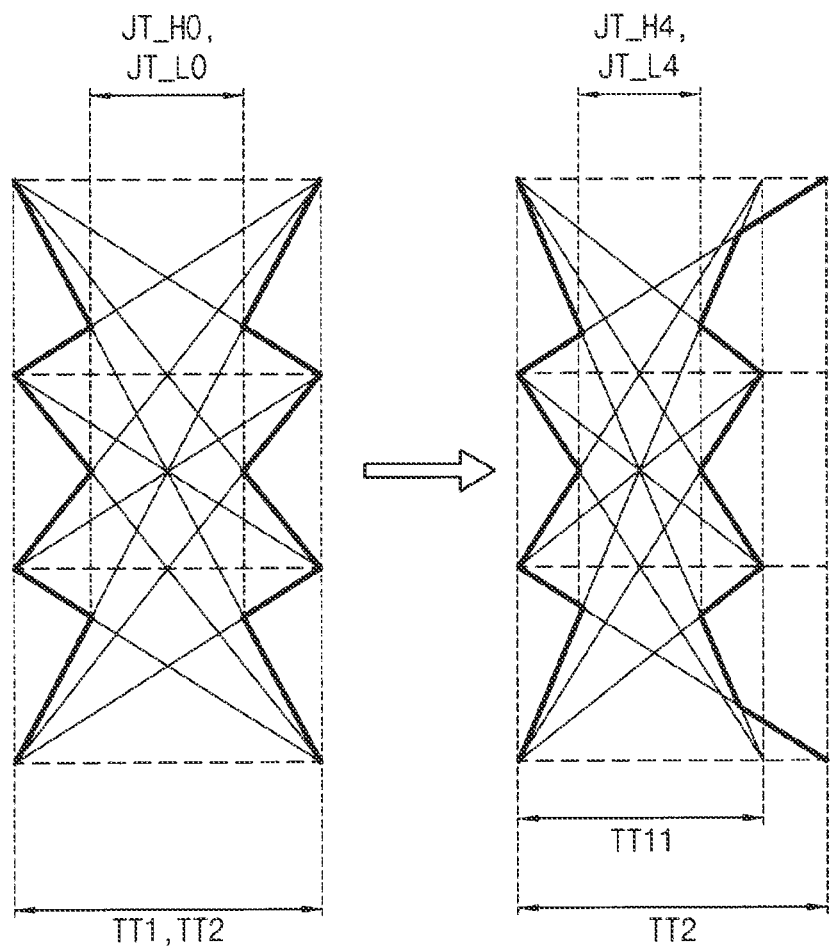

Referring to FIG. 11D, in the case on the right in FIG. 11D as compared to the case on the right in FIG. 11C, the edge detection circuits 523, 524, 525, 533, 534, and 535 may be additionally enabled. As such, slopes of a third rising edge (e.g., '00'→'01') transitioning from the first voltage level VL11 to the second voltage level VL21, the fourth rising edge (e.g., '01'→'11') transitioning from the second voltage level VL21 to the fourth voltage level VL41, a fifth rising edge (e.g., '01'→'10') transitioning from the second voltage level VL21 to the third voltage level VL31, a third falling edge (e.g., '11'→'10') transitioning from the fourth voltage level VL41 to the third voltage level VL31, a fourth falling edge (e.g., '10'→'00') transitioning from the third voltage level VL31 to the first voltage level VL11, and a fifth falling edge (e.g., '10'→'01') transitioning from the third voltage level VL31 to the second voltage level VL21 may further increase, and transition times of the third, fourth, and fifth rising edges and the third, fourth, and fifth falling edges may further decrease. Thus, the jitter characteristics of the eyes EYE11 and EYE31 may be further improved to JT_L4 and JT_H4.

Figure 11E:
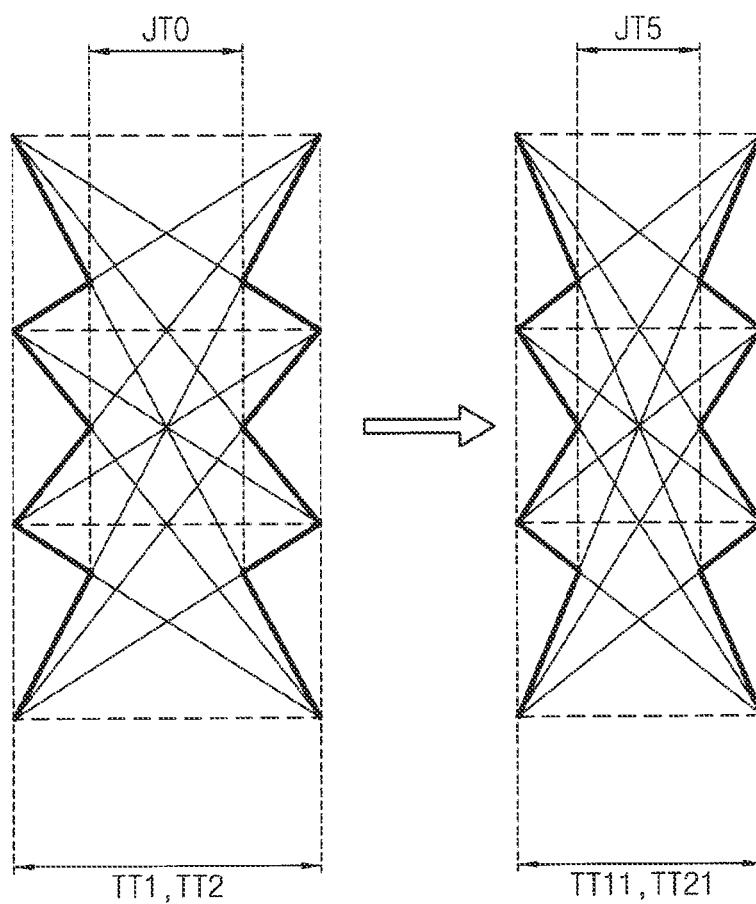

Referring to FIG. 11E, in the case on the right, all of the edge detection circuits 521, 522, 523, 524, 525, 526, 531, 532, 533, 534, 535, and 536 may be enabled, slopes of all of the rising edges and the falling edges may increase, and transition times of all of the rising edges and the falling edges may decrease. Thus, the jitter characteristics of all of the eyes EYE11, EYE21, and EYE31 may be improved from JT0 to JT5.

Figure 12:
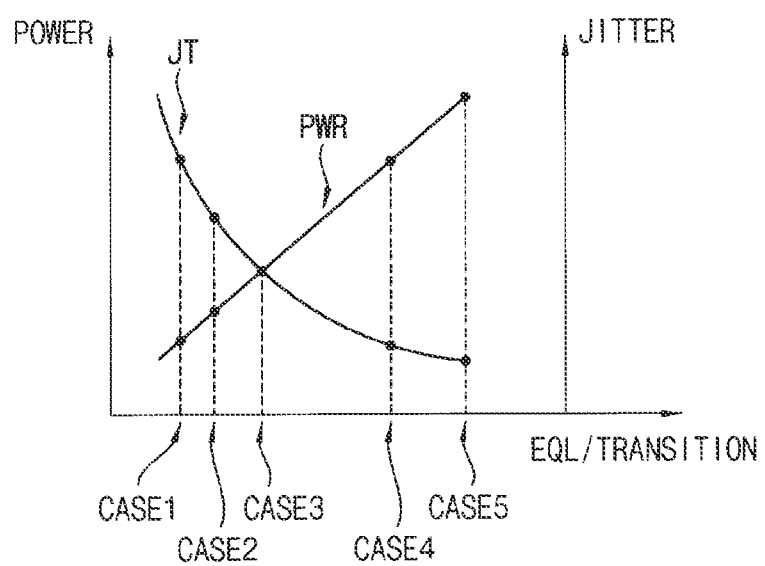

Referring to FIG. 12, the cases on the right in FIGS. 11A, 11B, 11C, 11D, and 11E are represented in the graph of FIG. 7C as CASE1, CASE2, CASE3, CASE4, and CASE5, respectively. As described above, the target and number of the equalizing operations may be set in consideration of the power consumption and characteristics of channels.

Figure 13:
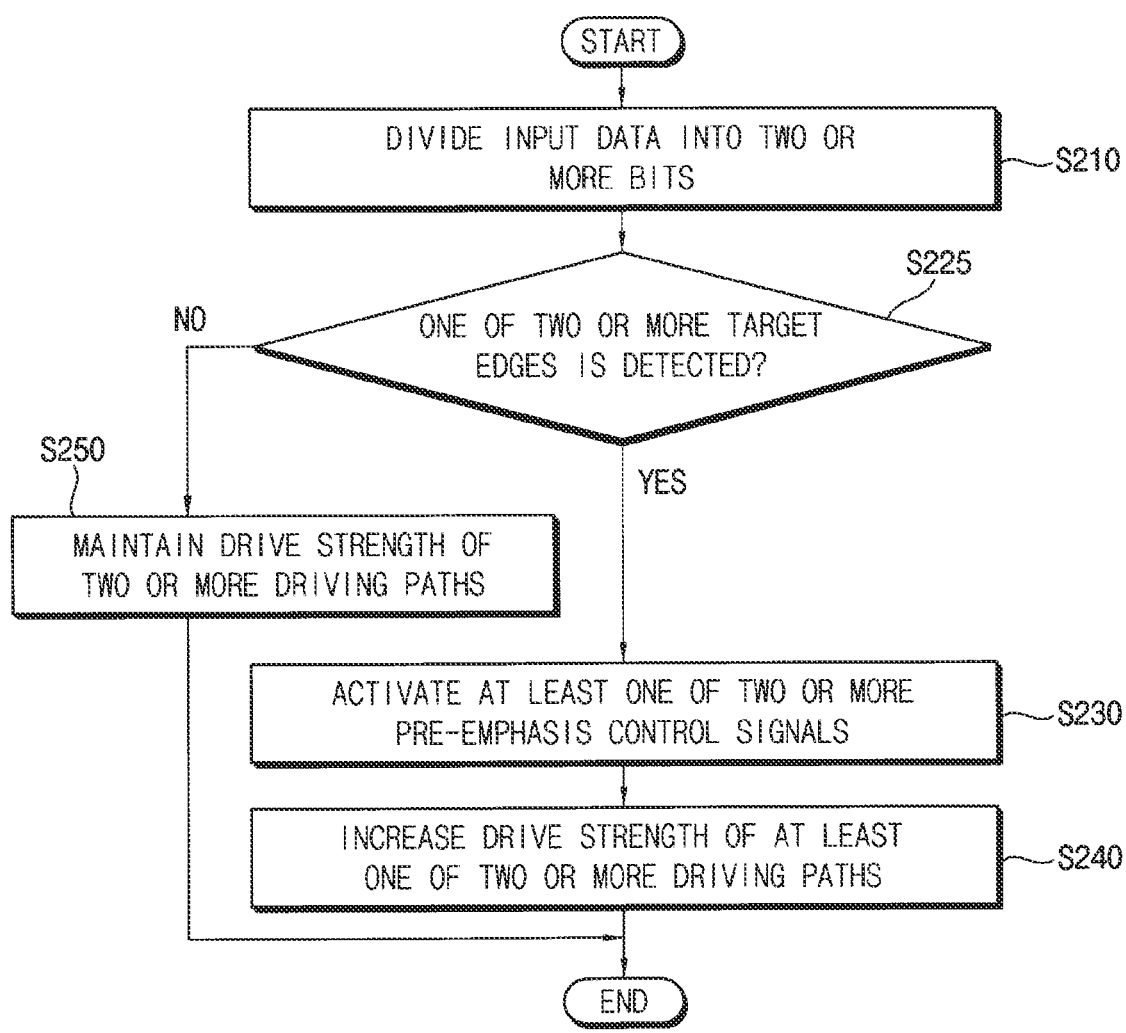
FIG. 13 is a flowchart illustrating an example of changing a drive strength of at least one of two or more driving paths in FIG. 1 according to an exemplary embodiment of the inventive concept.

FIG. 13 is a flowchart illustrating an example of changing a drive strength of at least one of two or more driving paths in FIG. 1 according to an exemplary embodiment of the inventive concept. The descriptions of elements already described with reference to FIG. 2 will be omitted.

Referring to FIGS. 1 and 13, when changing the drive strength of the at least one of the two or more driving paths (operation S200 of FIG. 1), operations S210, S230, S240, and S250 in FIG. 13 may be substantially the same as operations S210, S230, S240, and S250 in FIG. 2, respectively.

When one of two or more target edges on the output data signal is detected (operation S225: YES), at least one of the two or more pre-emphasis control signals may be activated (operation S230), and the drive strength of the at least one of the two or more driving paths may increase based on the activated pre-emphasis control signal such that a transition time of the output data signal for the detected target edge decreases (operation S240).

The example of FIG. 2 may correspond to FIG. 11A in which the equalizing operation is performed on only one edge, and the example of FIG. 13 may correspond to FIGS. 11B, 11C, 11D, and 11E in which the equalizing operation is performed on two or more edges.

Figure 14:
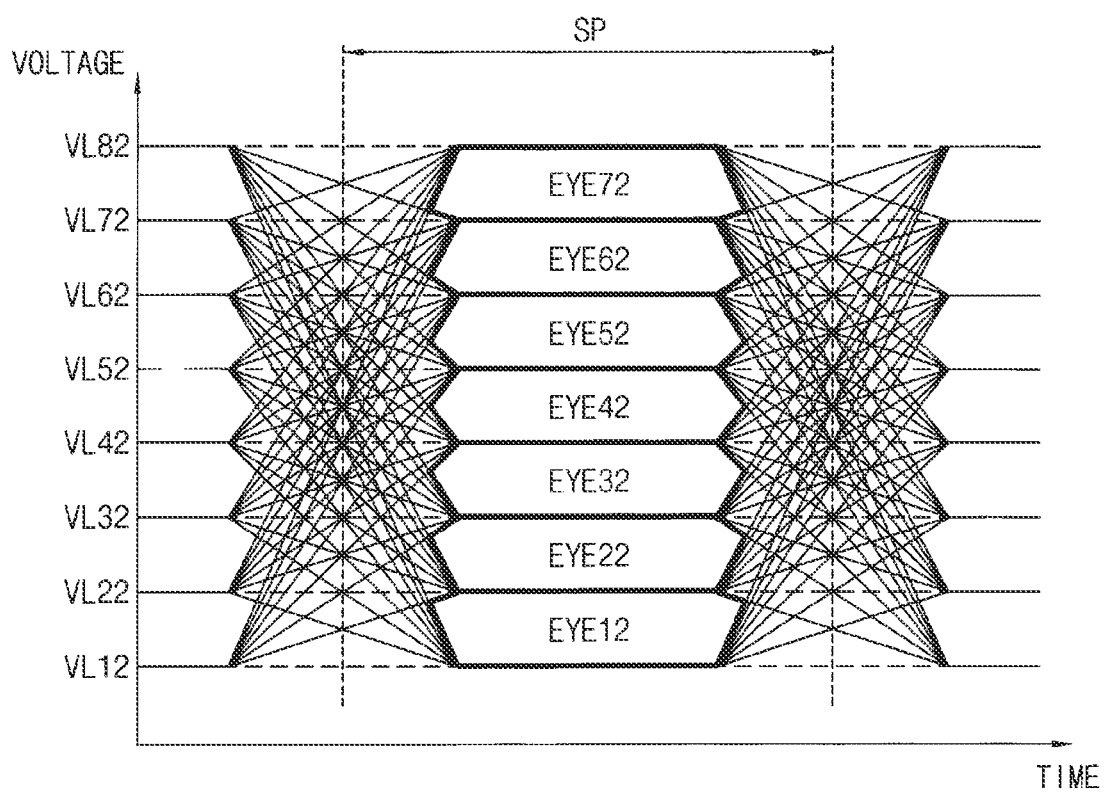
FIG. 14 is a diagram for describing a data signal generated by a method of generating a multi-level signal according to an exemplary embodiment of the inventive concept.

FIG. 14 is a diagram for describing a data signal generated by a method of generating a multi-level signal according to an exemplary embodiment of the inventive concept. The descriptions of elements already described with reference to FIG. 7B will be omitted.

Referring to FIG. 14, different first, second, third, fourth, fifth, sixth, seventh, and eighth voltage levels VL12, VL22, VL32, VL42, VL52, VL62, VL72, and VL82 of a data signal (e.g., a PAM8 signal) that is generated based on the 8-level scheme (e.g., the PAM8 scheme) are illustrated, and first, second, third, fourth, fifth, sixth, and seventh eyes EYE12, EYE22, EYE32, EYE42, EYE52, EYE62, and EYE72 of the data signal are illustrated. As described above, the equalizing operation may be selectively performed only on some edges that affect the eye characteristics.

Figure 15:
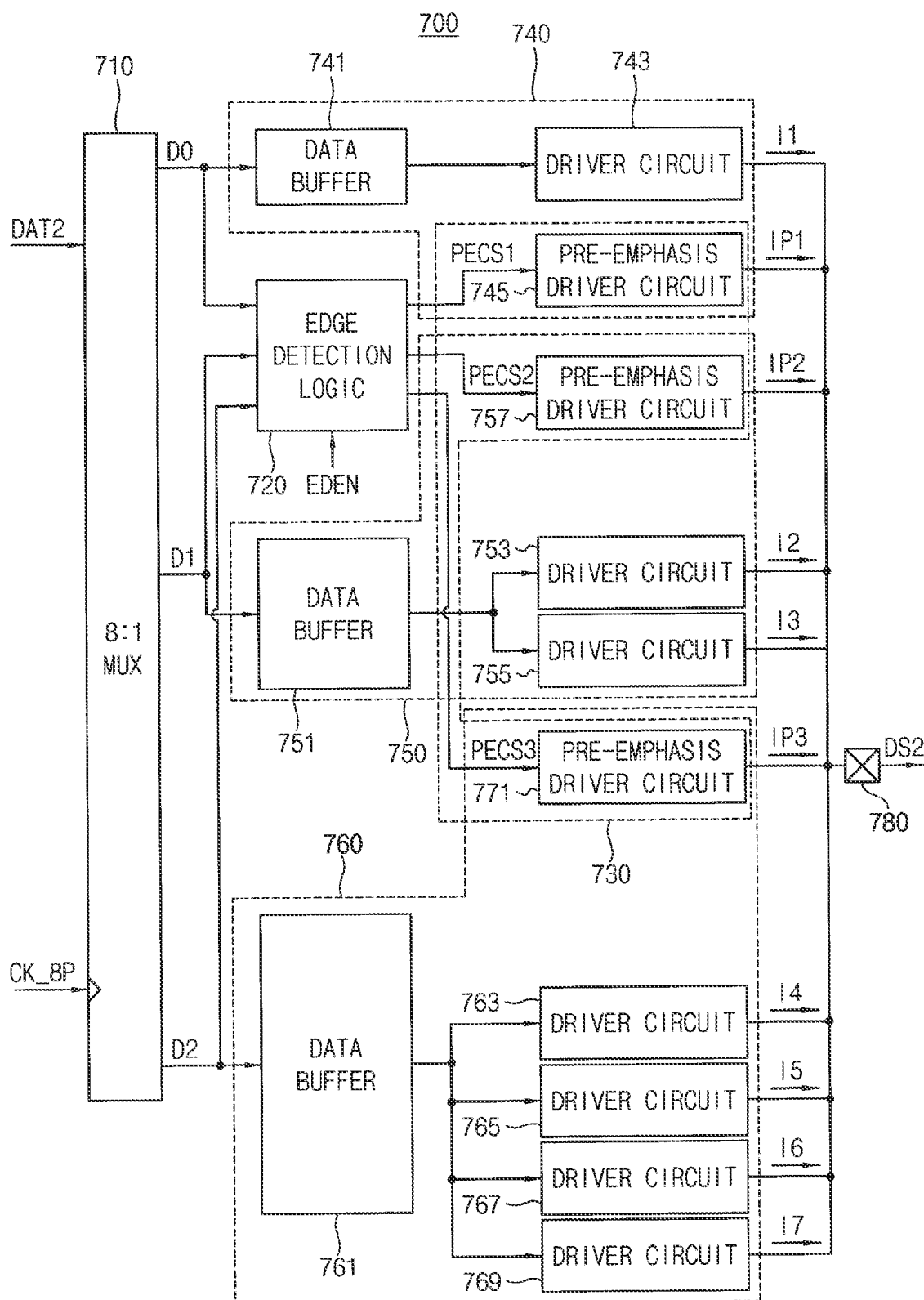
FIG. 15 is a block diagram illustrating a transmitter according to an exemplary embodiment of the inventive concept.

FIG. 15 is a block diagram illustrating a transmitter according to an exemplary embodiment of the inventive concept. The descriptions of elements already described with reference to FIG. 8 will be omitted.

Referring to FIG. 15, a transmitter 700 includes a multiplexer 710, an edge detection logic 720, and two or more driving paths 740, 750, and 760. The transmitter 700 may further include a data I/O pad 780. The multiplexer 710, the edge detection logic 720, the driving paths 740, 750, and 760, and the data I/O pad 780 may correspond to the multiplexer 510, the edge detection logic 520, the driving paths 540 and 550, and the data I/O pad 580 in FIG. 8, respectively.

In the example of FIG. 15, input data DAT2 may include a first bit D0, a second bit D1, and a third bit D2 that are different from one another, and the multiplexer 710 may divide the input data DAT2 into the first, second, and third bits D0, D1, and D2 based on an eight-phase clock signal CK_8P. The two or more driving paths 740, 750, and 760 may include a first driving path 740 that operates based on the first bit D0 and a first pre-emphasis control signal PECS1, a second driving path 750 that operates based on the second bit D1 and a second pre-emphasis control signal PECS2, and a third driving path 760 that operates based on the third bit D2 and a third pre-emphasis control signal PECS3. An output data signal DS2 may correspond to the data signal illustrated in FIG. 14, and may have one the first, second, third, fourth, fifth, sixth, seventh, and eighth voltage levels VL12, VL22, VL32, VL42, VL52, VL62, VL72, and VL82, that are different from one another, during one unit interval.

In exemplary embodiments of the inventive concept, the first bit D0 may be a LSB of the input data DAT2, the second bit D1 may be a central significant bit (CSB) of the input data DAT2, and the third bit D2 may be an MSB of the input data DAT2.

The first driving path 740 may include a first data buffer 741, a first driver circuit 743, and a first pre-emphasis driver circuit 745. The second driving path 750 may include a second data buffer 751, a second driver circuit 753, a third driver circuit 755, and a second pre-emphasis driver circuit 757. The third driving path 760 may include a third data buffer 761, a fourth driver circuit 763, a fifth driver circuit 765, a sixth driver circuit 767, a seventh driver circuit 769, and a third pre-emphasis driver circuit 771. Operations of the data buffers 741, 751, and 761, operations of the driver circuits 743, 753, 755, 763, 765, 767, and 769 generating driving currents I1, I2, I3, I4, I5, I6, and I7, respectively, and operations of the pre-emphasis driver circuits 745, 757, and 771 generating currents IP1, IP2, and IP3 may be substantially the same as those described with reference to FIG. 8.

Although FIG. 15 illustrates that a configuration 730 for increasing the drive strength includes the pre-emphasis driver circuits 745, 757, and 771 included in the driving paths 740, 750, and 760, the inventive concept is not limited thereto.

Figure 16:
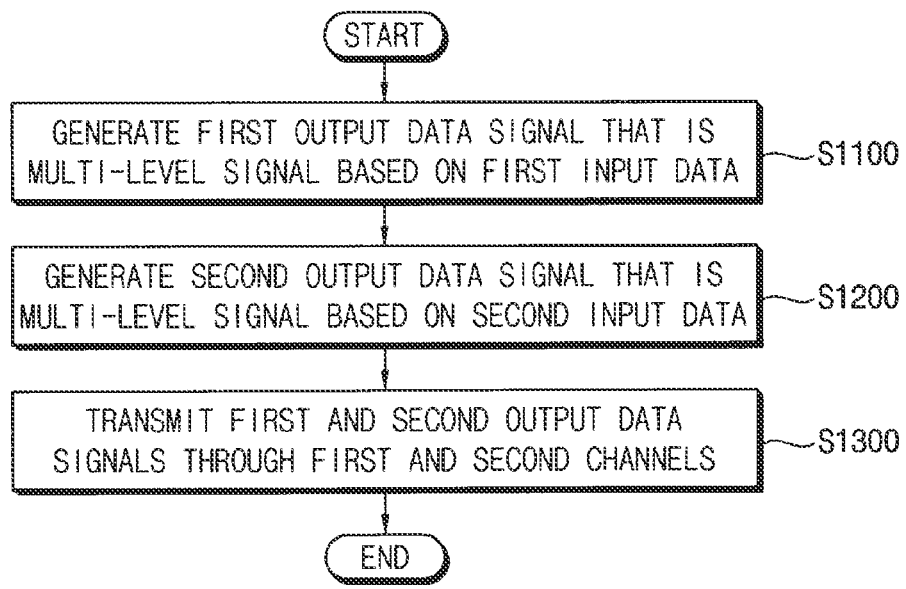
FIGS. 16 and 17 are flowcharts illustrating a method of transmitting data according to exemplary embodiments of the inventive concept.
Figure 17:
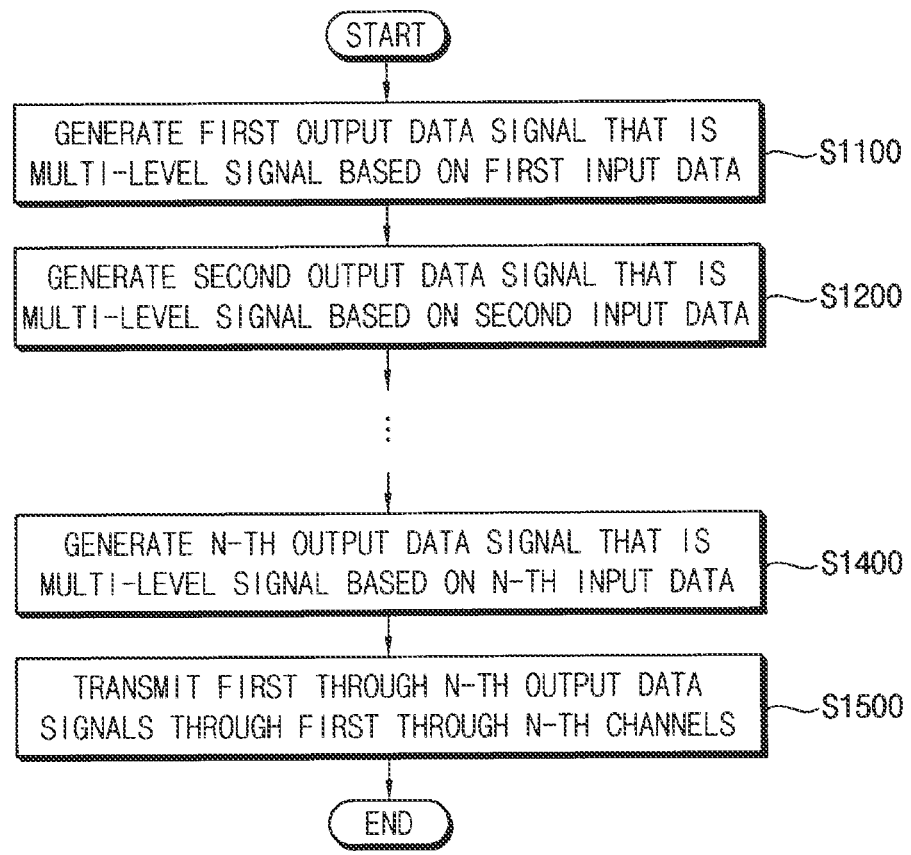

FIGS. 16 and 17 are flowcharts illustrating a method of transmitting data according to exemplary embodiments of the inventive concept.

Referring to FIG. 16, in a method of transmitting data according to an exemplary embodiment of the inventive concept, a first output data signal that is a multi-level signal is generated based on first input data (operation S1100). A second output data signal that is the multi-level signal is generated based on second input data (operation S1200). The first output data signal and the second output data signal are transmitted through a first channel and a second channel, respectively (operation S1300).

Referring to FIG. 17, in a method of transmitting data according to an exemplary embodiment of the inventive concept, operations S1100 and S1200 in FIG. 17 may be substantially the same as operations S1100 and S1200 in FIG. 16, respectively. An N-th output data signal that is the multi-level signal is generated based on N-th input data (operation S1400). The first through N-th output data signals are transmitted through first through N-th channels, respectively (operation S1500).

Each of operations S1100, S1200, and S1400 may be performed based on the method of generating the multi-level signal according to exemplary embodiments of the inventive concept described with reference to FIGS. 1 through 15.

For example, as described above, a drive strength of at least one of two or more driving paths may be changed based on the two or more bits included in the first input data such that a first transition time, during which the first output data signal is transitioned from a first voltage level to a second voltage level, is changed. The first output data signal may be generated such that the first transition time of the first output data signal is changed and a second transition time, during which the first output data signal is transitioned from the first voltage level to a third voltage level different from the second voltage level, is maintained.

Similarly, a drive strength of at least one of two or more driving paths may be changed based on the two or more bits included in the second input data such that a third transition time, during which the second output data signal is transitioned from the first voltage level to the second voltage level, is changed. The second output data signal may be generated such that the third transition time of the second output data signal is changed and a fourth transition time, during which the second output data signal is transitioned from the first voltage level to the third voltage level, is maintained.

As another example, a drive strength of at least one of two or more driving paths may be changed based on the two or more bits included in the second input data such that a third transition time, during which the second output data signal is transitioned from a fourth voltage level different from the first voltage level to the second voltage level, is changed. The second output data signal may be generated such that the third transition time of the second output data signal is changed and a fourth transition time, during which the second output data signal is transitioned from the fourth voltage level to the third voltage level, is maintained.

In exemplary embodiments of the inventive concept, characteristics of the first and second channels in FIG. 16 may be substantially the same as each other, and characteristics of the first through N-th channels in FIG. 17 may be substantially the same as one another. For example, all of the output data signals may have substantially the same waveform (e.g., one of the waveforms in FIGS. 11A through 11E).

In exemplary embodiments of the inventive concept, characteristics of the first and second channels in FIG. 16 may be different from each other, and characteristics of the first through N-th channels in FIG. 17 may be different from one another. For example, the output data signals may have different waveforms (e.g., different waveforms among the waveforms in FIGS. 11A through 11E) in consideration of the characteristics of the channels.

Figure 18A:
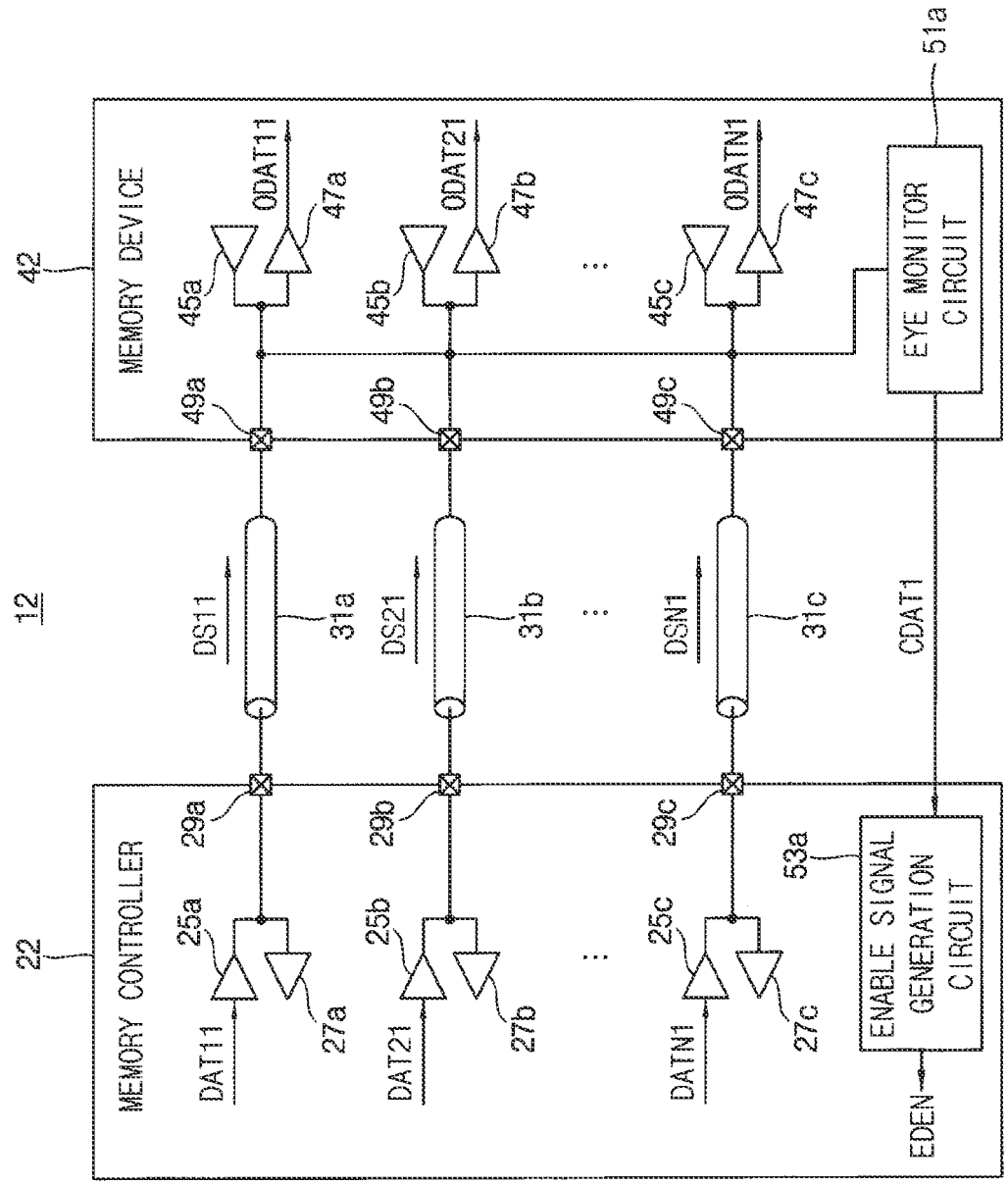
FIGS. 18A and 18B are block diagrams illustrating a memory system according to an exemplary embodiment of the inventive concept.
Figure 18B:
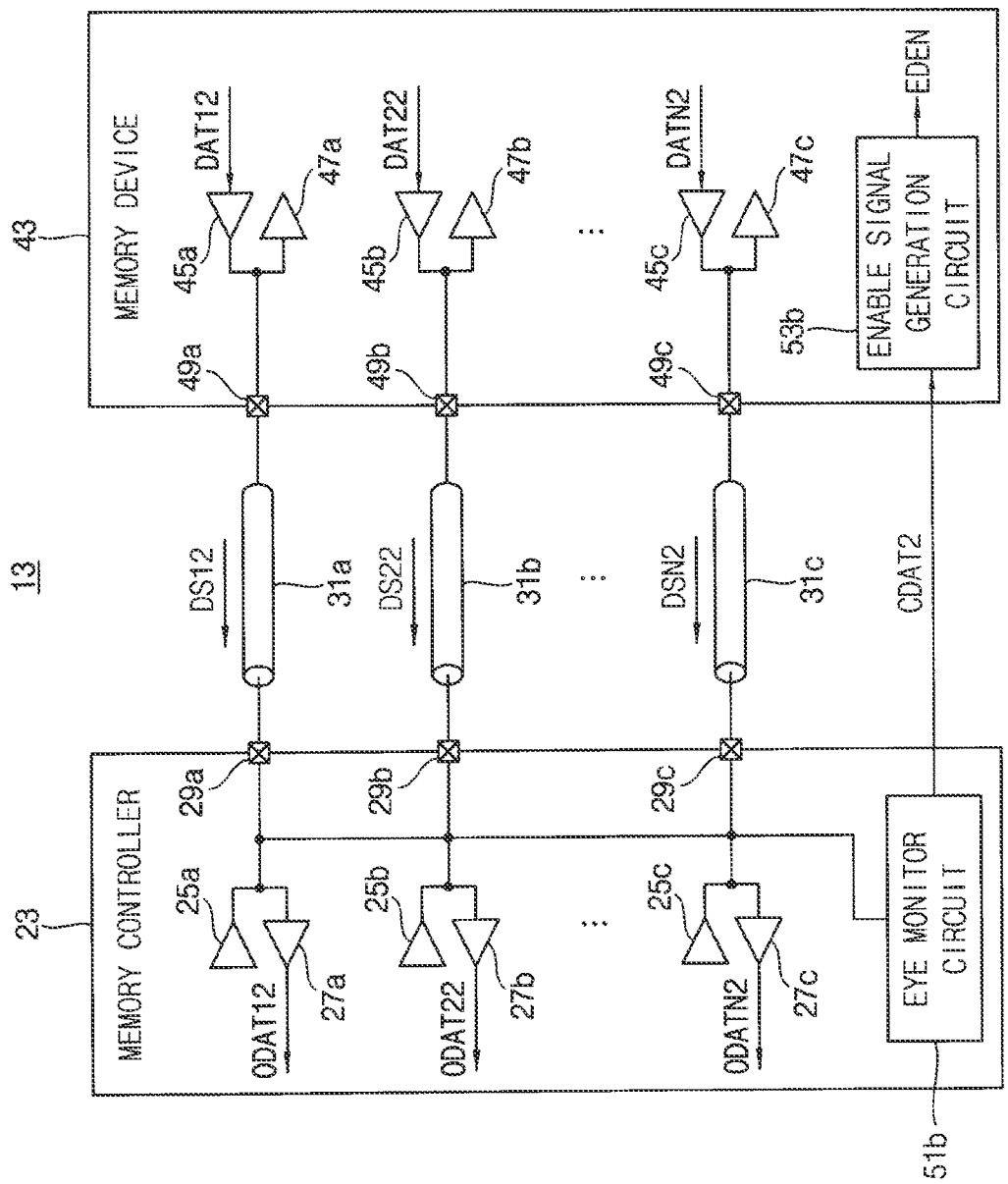

In exemplary embodiments of the inventive concept, the methods of transmitting the data of FIGS. 16 and 17 may be performed by the memory system according to exemplary embodiments of the inventive concept. For example, as described with reference to FIG. 4A, the output data signals may be generated by the memory controller 21 (e.g., by the transmitters 25b, and 25c). As another example, as described with reference to FIG. 4B, the output data signals may be generated by the memory device 41 (e.g., by the transmitters 45a, 45b, and FIGS. 18A and 18B are block diagrams illustrating a memory system according to an exemplary embodiment of the inventive concept. The descriptions of elements already described with reference to FIGS. 4A and 4B will be omitted.

Referring to FIG. 18A, a memory system 12 includes a memory controller 22, a memory device 42, and the plurality of channels 31a, 31b, and 31c.

The memory system 12 may be substantially the same as the memory system 11 of FIG. 4A, except that the memory device 42 and the memory controller 22 further include an eye monitor circuit 51a and an enable signal generation circuit 53a, respectively.

The eye monitor circuit 51a may be connected to the plurality of channels 31a, 31b, and 31c, and may generate characteristic data CDAT1 that represents characteristics of the channels 31a, 31b, and 31c based on the received output data signals DS11, DS21 and DS31. The enable signal generation circuit 53a may generate the edge detection enable signals EDEN based on the characteristic data CDAT1. It may be determined in real time, based on the characteristics of the channels 31a, 31b, and 31c, that the equalizing operation is to be performed on which edge.

Referring to FIG. 18B, a memory system 13 includes a memory controller 23, a memory device 43, and the plurality of channels 31a, 31b, and 31c.

The memory system 13 may be substantially the same as the memory system 11 of FIG. 4B, except that the memory controller 23 and the memory device 43 further include an eye monitor circuit 51b generating characteristic data CDAT2 and an enable signal generation circuit 53b, respectively. The eye monitor circuit 51b and the enable signal generation circuit 53b may be substantially the same as the eye monitor circuit 51a and the enable signal generation circuit 53a in FIG. 18A, respectively.

In exemplary embodiments of the inventive concept, the eye monitor circuits 51a and 51b and the enable signal generation circuits 53a and 53b may be provided for each channel and/or may be disposed outside the memory controller and the memory device.

Figure 19:
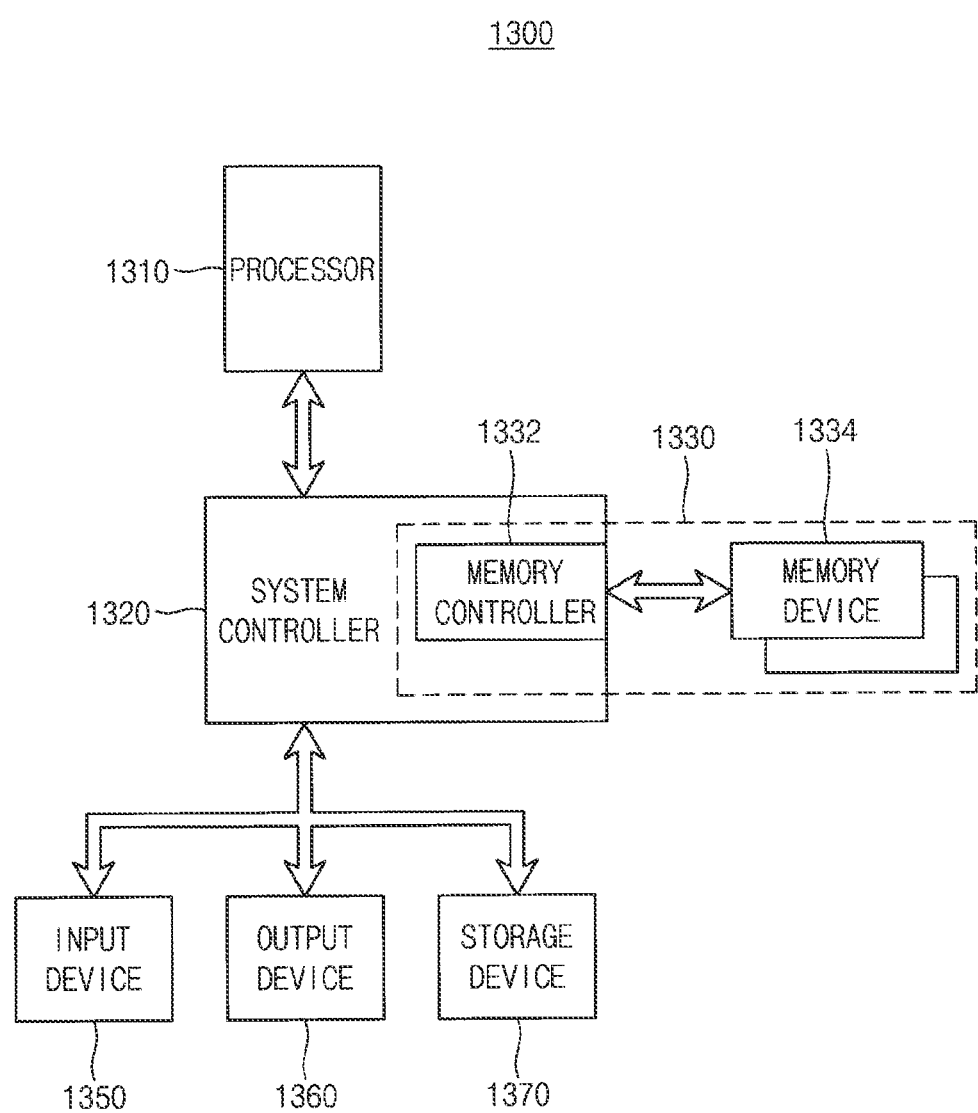
FIG. 19 is a block diagram illustrating a computing system according to an exemplary embodiment of the inventive concept.

FIG. 19 is a block diagram illustrating a computing system according to an exemplary embodiment of the inventive concept.

Referring to FIG. 19, a computing system 1300 includes a processor 1310, a system controller 1320, and a memory system 1330. The computing system 1300 may further include an input device 1350, an output device 1360, and a storage device 1370.

The memory system 1330 includes a plurality of memory devices 1334 and a memory controller 1332 for controlling the memory devices 1334. The memory controller 1332 may be included in the system controller 1320. The memory system 1330 may be the memory system according to exemplary embodiments of the inventive concept, and may perform the method of generating the multi-level signal and the method of transmitting the data according to exemplary embodiments of the inventive concept.

The processor 1310 may perform various computing functions, such as executing specific software instructions for performing specific calculations or tasks. The processor 1310 may be connected to the system controller 1320 via a processor bus. The system controller 1320 may be connected to the input device 1350, the output device 1360, and the storage device 1370 via an expansion bus. As such, the processor 1310 may control the input device 1350, the output device 1360, and the storage device 1370 using the system controller 1320.

Figure 20:
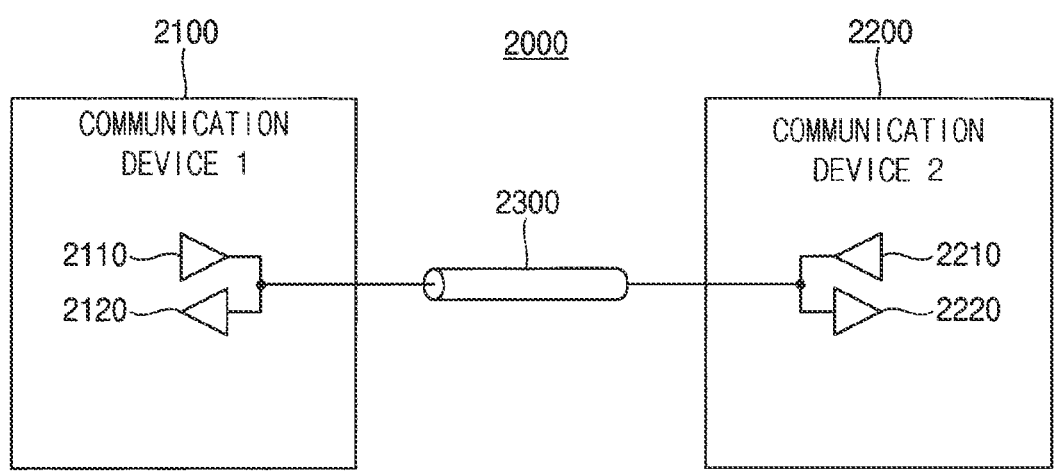
FIG. 20 is a block diagram illustrating a communication system according to an exemplary embodiment of the inventive concept.

FIG. 20 is a block diagram illustrating a communication system according to an exemplary embodiment of the inventive concept.

Referring to FIG. 20, a communication system 2000 includes a first communication device 2100, a second communication device 2200, and a channel 2300.

The first communication device 2100 includes a first transmitter 2110 and a first receiver 2120. The second communication device 2200 includes a second transmitter 2210 and a second receiver 2220. The first transmitter 2110 and the first receiver 2120 are connected to the second transmitter 2210 and the second receiver 2220 through the channel 2300. In exemplary embodiments of the inventive concept, each of the first and second communication devices 2100 and 2200 may include a plurality of transmitters and a plurality of receivers, and the communication system 2000 may include a plurality of channels for connecting the plurality of transmitters and the plurality of receivers.

The transmitters 2110 and 2210 may be the transmitter according to exemplary embodiments of the inventive concept, and may perform the method of generating the multi-level signal and the method of transmitting the data according to exemplary embodiments of the inventive concept.

The inventive concept may be applied to various devices and systems that include memory devices and memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

In the method of generating the multi-level signal, the method of transmitting the data, and the transmitter and the memory system according to exemplary embodiments of the inventive concept, a selective or adaptive equalization scheme may be implemented. In the selective equalization scheme, existing or conventional driving paths may be used as is, and the equalizing operation may be performed only when a specific level transition occurs on the output data signal. In other words, the equalizing operation may be performed only on some level transitions that are capable of occurring on the multi-level signal. Accordingly, as compared to a case where the equalizing operation is performed on all level transitions, power consumption may be reduced and the signal characteristic may be efficiently improved or enhanced.

While the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A transmitter comprising:
   a multiplexer configured to receive first input data including first bits and second input data including second bits;
   an edge detection logic circuit configured to:
      receive the first bits of the first input data;
      detect a first edge based on the first bits of the first input data; and
      activate a first pre-emphasis control signal based on the first edge;
   a plurality of driving paths configured to generate a first driving current based on the first pre-emphasis control signal and generate a multi-level signal based on the first driving current;
   wherein the edge detection logic circuit is further configured to:
      receive the second bits of the second input data; and
      receive an edge detection enable signal and activate a second pre-emphasis control signal based on the edge detection enable signal,
   wherein the plurality of driving paths are further configured to generate a second driving current based on the second pre-emphasis control signal and generate the multi-level signal based on the second driving current,
   wherein the transmitter further comprises an enable signal generation circuit configured to generate the edge detection enable signal, the edge detection enable signal being generated based on characteristic data of a channel through which the multi-level signal is transmitted,
   wherein the edge detection logic circuit comprises a plurality of edge detection circuits, and
   wherein at least one of the plurality of edge detection circuits is selectively activated based on the edge detection enable signal to adjust the second driving current of the plurality of driving paths based on the second pre-emphasis control signal to drive a second edge.

2. The transmitter of claim 1, wherein the enable signal generation circuit is configured to receive the characteristic data of the channel from an eye monitor circuit of a receiver.

3. The transmitter of claim 1, wherein a slope of the second edge is greater than a slope of the first edge.

4. The transmitter of claim 1, wherein a slope of the second edge is smaller than a slope of the first edge.

5. The transmitter of claim 1, wherein the multi-level signal is output as one of a first voltage level, a second voltage level, and a third voltage level.

6. The transmitter of claim 1, wherein the multi-level signal is output as one of a first voltage level, a second voltage level, a third voltage level, and a fourth voltage level.

7. The transmitter of claim 1, wherein each of the plurality of edge detection circuits comprises:
   a NOR gate configured to perform a NOR operation on the first bits;
   an AND gate configured to perform an AND operation on the first bits;
   a delay circuit configured to delay an output of the NOR gate; and
   a multiplexer circuit configured to output one of an output of the delay circuit and an output of the AND gate as the first pre-emphasis control signal and the second pre-emphasis control signal based on the edge detection enable signal.

8. The transmitter of claim 1, wherein the plurality of driving paths comprises:
   a first driver circuit configured to drive one of the first bits of the first input data to generate a first current;
   a second driver circuit configured to drive another one of the first bits of the first input data to generate a second current;
   a first pre-emphasis driver circuit configured to generate a first pre-emphasis current based on the edge detection enable signal; and
   a second pre-emphasis driver circuit configured to generate a second pre-emphasis current based on the edge detection enable signal,
   wherein the second driving current is generated based on a combination of one or more of the first current, the second current, the first pre-emphasis current, and the second pre-emphasis current, and
   wherein each of the first pre-emphasis control signal and the second pre-emphasis control signal selectively activates the first pre-emphasis driver circuit and the second pre-emphasis driver circuit.

9. The transmitter of claim 1, wherein the plurality of edge detection circuits comprise six rising edge detection circuits and six falling edge detection circuits.

10. The transmitter of claim 9,
wherein at least one of the six rising edge detection circuits is activated based on a slope of the second edge being greater than a slope of the first edge, and
wherein at least one of the six falling edge detection circuits is activated based on a slope of the second edge being smaller than a slope of the first edge.

11. A memory system comprising:
a transmitter comprising:
a multiplexer configured to receive first input data including first bits and second input data including second bits;
an edge detection logic circuit configured to:
receive the first bits of the first input data from the multiplexer;
detect a first edge based on the first bits of the first input data; and
activate a first pre-emphasis control signal based on the first edge;
a plurality of driving paths configured to generate a first driving current based on the first pre-emphasis control signal and generate a first multi-level signal based on the first driving current; and
a receiver configured to receive the first multi-level signal from the transmitter through one or more channels, the receiver comprising:
an eye monitor circuit configured to generate characteristic data of the one or more channels based on the first multi-level signal, and transmit the characteristic data to the transmitter,
wherein the transmitter further comprises:
an enable signal generation circuit configured to receive the characteristic data from the eye monitor circuit of the receiver, and generate an edge detection enable signal based on the characteristic data,
wherein the edge detection logic circuit of the transmitter is further configured to:
receive the second bits of the second input data from the multiplexer; and
receive the edge detection enable signal from the enable signal generation circuit and activate a second pre-emphasis control signal based on the edge detection enable signal,
wherein the plurality of driving paths are further configured to generate a second driving current based on the second pre-emphasis control signal and generate a second multi-level signal based on the second driving current,
wherein the edge detection logic circuit comprises a plurality of edge detection circuits, and
wherein at least one of the plurality of edge detection circuits is selectively activated based on the edge detection enable signal to adjust the second driving current of the plurality of driving paths based on the second pre-emphasis control signal to drive a second edge.

12. The memory system of claim 11, wherein a slope of the second edge is greater than a slope of the first edge.

13. The memory system of claim 11, wherein a slope of the second edge is smaller than a slope of the first edge.

14. The memory system of claim 11, wherein the multi-level signal is output as one of a first voltage level, a second voltage level, a third voltage level, and a fourth voltage level.

15. The memory system of claim 11, wherein each of the plurality of edge detection circuits comprises:

a NOR gate configured to perform a NOR operation on the first bits;
an AND gate configured to perform an AND operation on the first bits;
a delay circuit configured to delay an output of the NOR gate; and
a multiplexer circuit configured to output one of an output of the delay circuit and an output of the AND gate as the first pre-emphasis control signal and the second pre-emphasis control signal based on the edge detection enable signal.

16. The memory system of claim 11, wherein the plurality of driving paths comprises:
a first driver circuit configured to drive one of the first bits of the first input data to generate a first current;
a second driver circuit configured to drive another one of the first bits of the first input data to generate a second current;
a first pre-emphasis driver circuit configured to generate a first pre-emphasis current based on the edge detection enable signal; and
a second pre-emphasis driver circuit configured to generate a second pre-emphasis current based on the edge detection enable signal,
wherein the second driving current is generated based on a combination of one or more of the first current, the second current, the first pre-emphasis current, and the second pre-emphasis current, and
wherein each of the first pre-emphasis control signal and the second pre-emphasis control signal selectively activates the first pre-emphasis driver circuit and the second pre-emphasis driver circuit.

17. A method of generating a multi-level signal, the method comprising:
receiving, by an input circuit, first input data including first bits and second input data including second bits;
detecting, by at least one of a plurality of edge detection circuits, a first edge based on the first bits of the first input data;
activating a first pre-emphasis control signal based on the first edge;
generating a first driving current based on the first pre-emphasis control signal;
outputting a first multi-level signal based on the first driving current from a plurality of driving paths;
receiving the second bits of the second input data;
receiving characteristic data of one or more channels through which the first multi-level signal is transmitted;
generating, by an enable signal generation circuit, an edge detection enable signal based on the characteristic data;
activating a second pre-emphasis control signal based on the edge detection enable signal;
generating a second driving current based on the second pre-emphasis control signal; and
outputting a second multi-level signal based on the second driving current from the plurality of driving paths,
wherein the method further comprises selectively activating the at least one of the plurality of edge detection circuits in the edge detection logic circuit based on the edge detection enable signal to adjust the second driving current of the plurality of driving paths based on the second pre-emphasis control signal to drive a second edge.

18. The method of claim 17, wherein the input circuit is an input circuit of the edge detection logic circuit.

19. The method of claim 17, wherein the characteristic data is received from an eye monitor circuit of a receiver.

20. The method of claim 17, wherein a slope of the second edge is different than a slope of the first edge.

* * * * *